United States Patent
Yamazaki et al.

(10) Patent No.: US 10,488,887 B2
(45) Date of Patent: Nov. 26, 2019

(54) ELECTRONIC DEVICE

(71) Applicant: Semiconductor Energy Laboratory Co., Ltd., Atsugi-shi, Kanagawa-ken (JP)

(72) Inventors: Shunpei Yamazaki, Tokyo (JP); Hideki Uochi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/722,293

(22) Filed: Oct. 2, 2017

(65) Prior Publication Data

US 2018/0095502 A1    Apr. 5, 2018

(30) Foreign Application Priority Data

Oct. 4, 2016 (JP) ................. 2016-196211
Oct. 4, 2016 (JP) ................. 2016-196213

(51) Int. Cl.
*G06F 1/16* (2006.01)
*H04M 1/02* (2006.01)
(Continued)

(52) U.S. Cl.
CPC .......... *G06F 1/1652* (2013.01); *F16M 11/38* (2013.01); *F16M 13/00* (2013.01); *F21V 15/04* (2013.01);
(Continued)

(58) Field of Classification Search
CPC ......... G06F 1/1652; G06F 2203/04102; G06F 1/1616; G06F 1/1618; G06F 1/1626;
(Continued)

(56) References Cited

U.S. PATENT DOCUMENTS 9,204,565 B1 * 12/2015 Lee .................... E05D 7/00
9,810,406 B2 * 11/2017 Endo .................. H01L 27/323
(Continued)

FOREIGN PATENT DOCUMENTS

JP          05-289619 A     11/1993
WO     WO-2010/106590     9/2010

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 27, pp. 57-60.
(Continued)

*Primary Examiner* — Dimary S Lopez Cruz
*Assistant Examiner* — Ingrid D Wright
(74) *Attorney, Agent, or Firm* — Fish & Richardson P.C.

(57) ABSTRACT

An electronic device with favorable reliability is provided. The electronic device can be folded in half and includes a bendable display device. In the electronic device, a first space is provided in the neighborhood of a hinge that connects two housings. Part of the display device is stored in a second space when the electronic device is folded, which prevents excessing bending of the display device and increases reliability. The display device may be provided on a side surface of the housings, which increases visibility. The side surface of the housings preferably includes a curved surface. The display device may include a first pixel reflecting visible light and a second pixel emitting visible light, which increases the visibility and decreases power consumption of the electronic device.

20 Claims, 28 Drawing Sheets

(51) Int. Cl.
*F16M 11/38* (2006.01)
*F21V 15/04* (2006.01)
*F21V 21/30* (2006.01)
*H01L 27/32* (2006.01)
*H01L 51/00* (2006.01)
*F16M 13/00* (2006.01)

(52) U.S. Cl.
CPC .............. *F21V 21/30* (2013.01); *G06F 1/165* (2013.01); *G06F 1/1616* (2013.01); *G06F 1/1618* (2013.01); *G06F 1/1626* (2013.01); *G06F 1/1643* (2013.01); *G06F 1/1681* (2013.01); *H01L 27/323* (2013.01); *H01L 27/326* (2013.01); *H01L 27/3232* (2013.01); *H01L 51/0097* (2013.01); *H04M 1/0216* (2013.01); *H04M 1/0268* (2013.01); *H04M 2250/16* (2013.01); *Y02E 10/549* (2013.01)

(58) Field of Classification Search
CPC ...... G06F 1/1681; G06F 1/1643; G06F 1/165; F16M 11/38; F21V 15/04; F21V 21/20; F21V 21/30; H01L 27/323; H01L 27/3232; H01L 51/0097; H05K 5/0021; H05K 5/0217; H04M 2250/16; H04M 1/0268; H04M 1/0216; Y02E 10/549
See application file for complete search history.

(56) References Cited

U.S. PATENT DOCUMENTS

| | | | | |
|---|---|---|---|---|
| 9,958,976 | B2* | 5/2018 | Endo | G06F 1/1652 |
| 2008/0158795 | A1* | 7/2008 | Aoki | G06F 1/1616 361/679.27 |
| 2012/0008267 | A1 | 1/2012 | Watanabe | |
| 2013/0300697 | A1 | 11/2013 | Kim et al. | |
| 2014/0042293 | A1* | 2/2014 | Mok | G06F 1/1652 248/682 |
| 2014/0098471 | A1* | 4/2014 | Nam | H05K 7/00 361/679.01 |
| 2014/0306260 | A1 | 10/2014 | Yamazaki et al. | |
| 2014/0319550 | A1 | 10/2014 | Yamazaki et al. | |
| 2015/0023030 | A1 | 1/2015 | Tsukamoto | |
| 2015/0023031 | A1 | 1/2015 | Endo | |
| 2015/0261259 | A1 | 9/2015 | Endo et al. | |
| 2016/0014914 | A1* | 1/2016 | Stroetmann | G06F 1/1616 312/223.1 |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

* cited by examiner

FIG. 14A
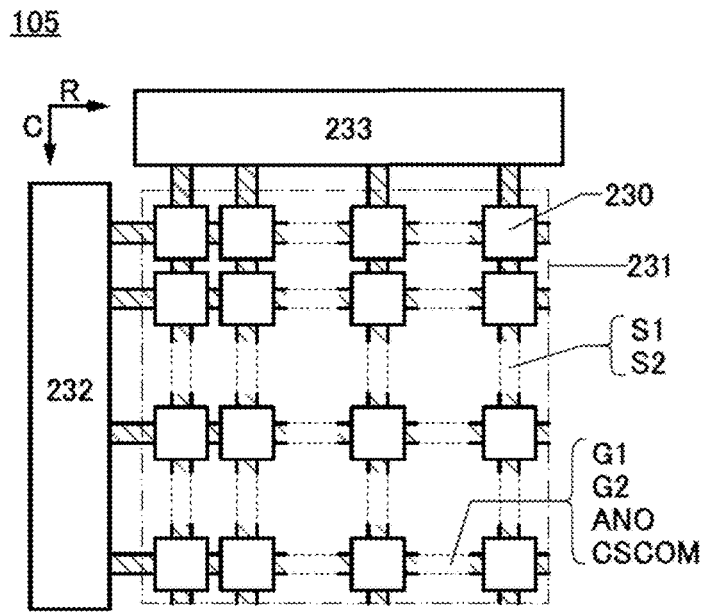
FIG. 14B1
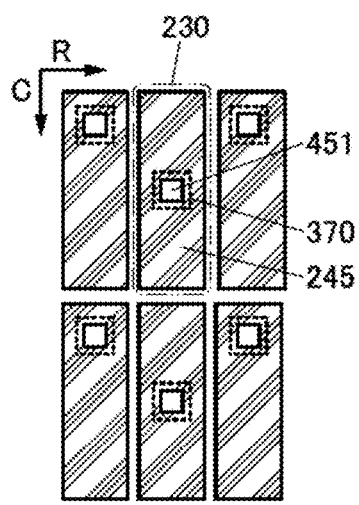
FIG. 14B2
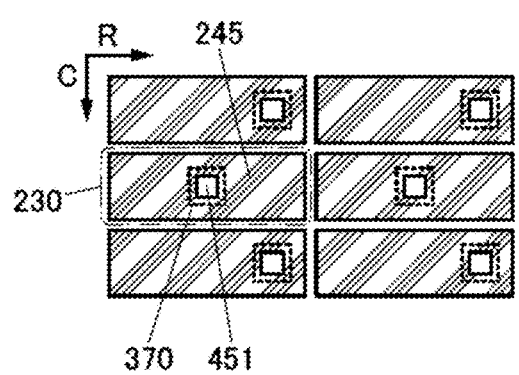
FIG. 14B3
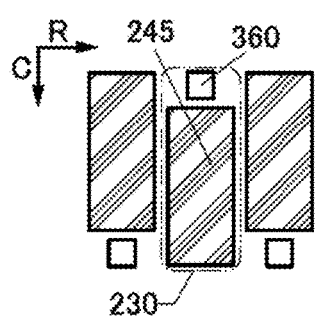
FIG. 14B4
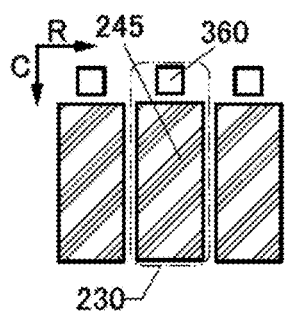

FIG. 17A1
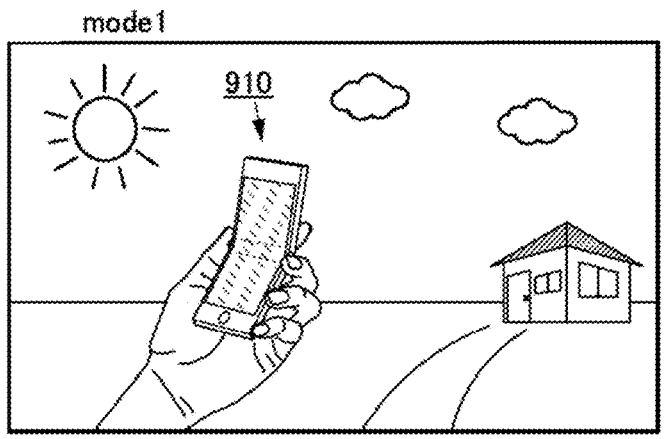
FIG. 17A2
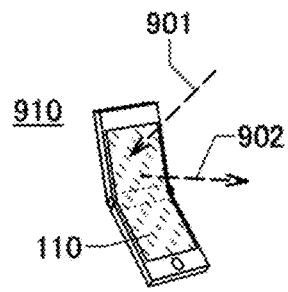
FIG. 17B1
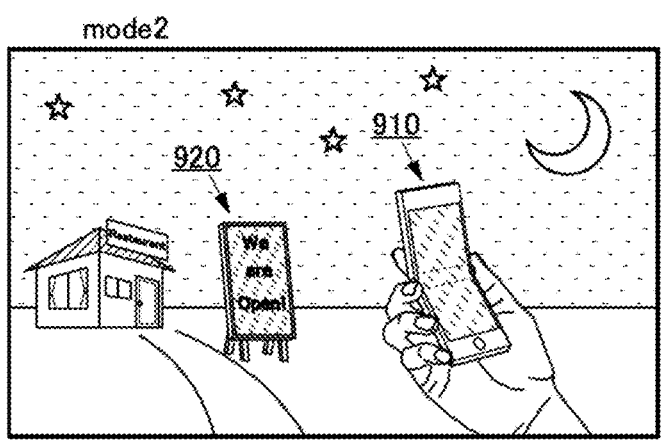
FIG. 17B2
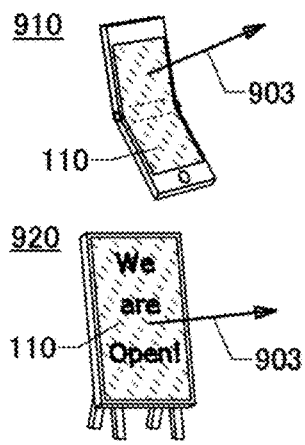
FIG. 17C1
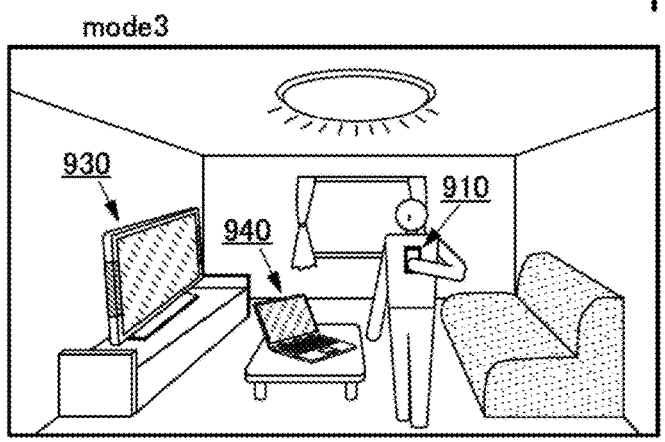
FIG. 17C2
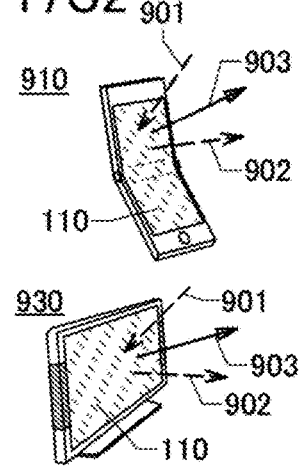

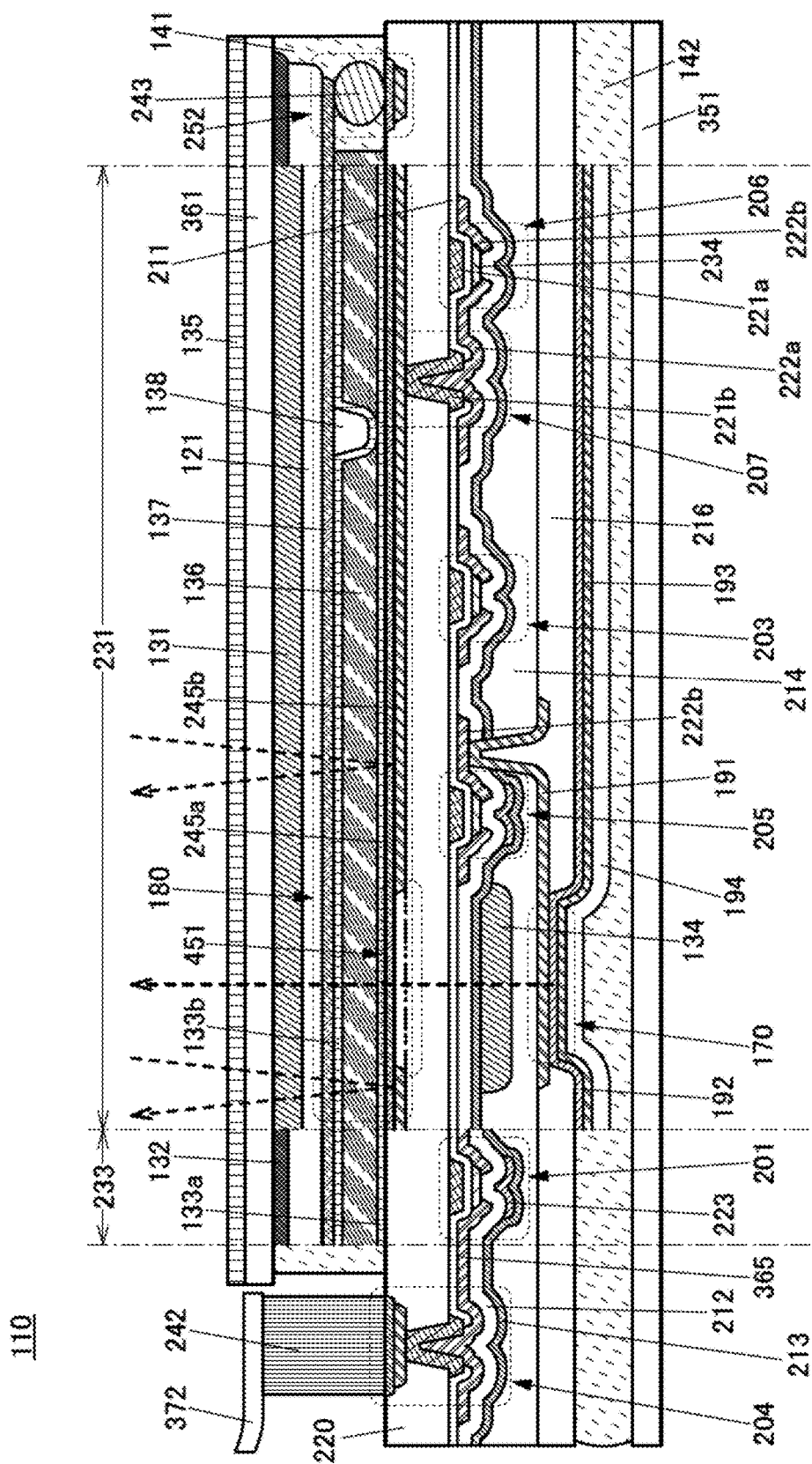

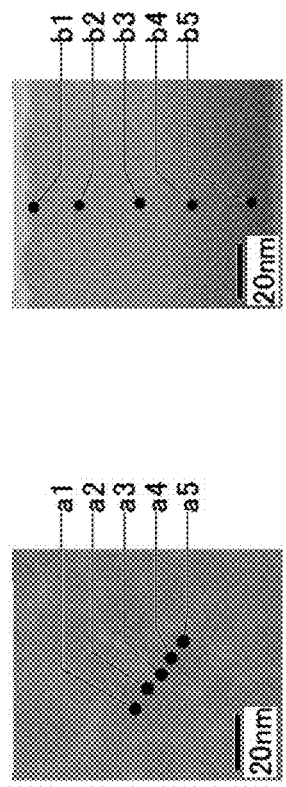
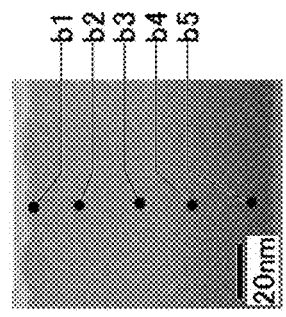
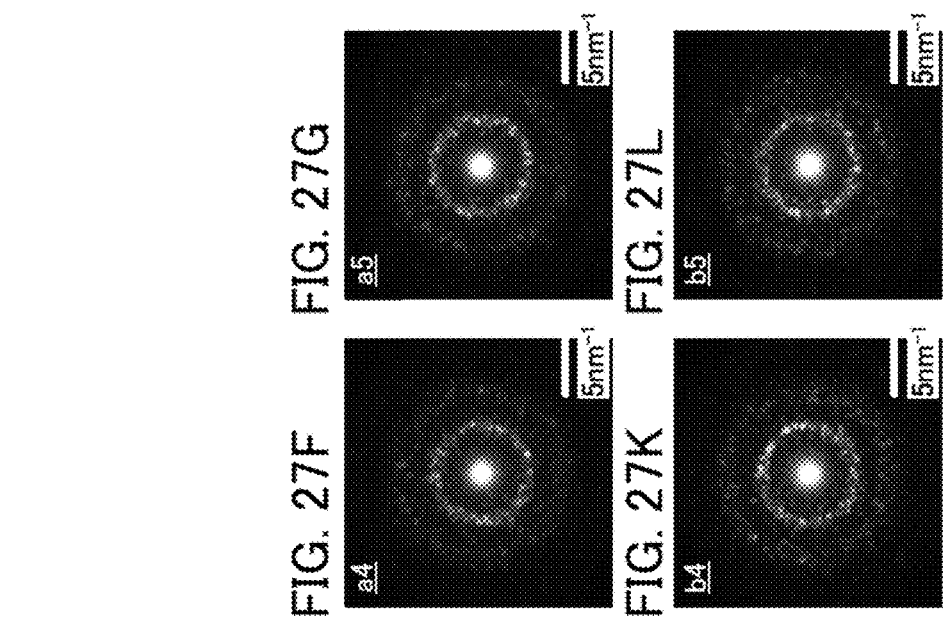
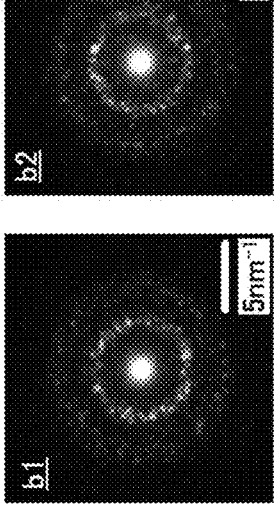

ELECTRONIC DEVICE

BACKGROUND OF THE INVENTION

1. Field of the Invention

One embodiment of the invention disclosed in this specification and the like relates to an object, a method, or a manufacturing method. One embodiment of the invention disclosed in this specification and the like also relates to a process, a machine, manufacture, or a composition of matter. In particular, one embodiment of the present invention relates to a display device or an electronic device.

In this specification and the like, a semiconductor device generally means a device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

2. Description of the Related Art

In recent years, portable electronic devices such as mobile phones, smartphones, and tablet information terminals have been widespread. To enhance the portability of an electronic device, the miniaturization and light weight of the electronic device are highly desired. However, there is a demand for an increase in the size of a display portion for displaying information because the amount of data an electronic device deals with is increasing.

To meet these demands, a foldable electronic device has been proposed. For example, Patent Document 1 discloses an electronic device including two display portions, which is folded when not in use so that the two display portions face each other.

REFERENCE

Patent Document

[Patent Document 1] Japanese Published Patent Application No. H5-289619

SUMMARY OF THE INVENTION

However, the two display portions are independently provided in the electronic device disclosed in Patent Document 1, and one image cannot be displayed as a whole. Although one image can be divided and displayed on the two display portions, the visibility is low because the two display portions are apart from each other.

An object of one embodiment of the present invention is to provide a display device, electronic device, or the like having favorable visibility. Another object of one embodiment of the present invention is to provide a display device, electronic device, or the like having high display quality. Another object of one embodiment of the present invention is to provide a display device, electronic device, or the like having high reliability. Another object of one embodiment of the present invention is to provide a novel display device, electronic device, or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an electronic device which includes a first housing, a second housing, a hinge, a space, and a display device. In the electronic device, the first housing and the second housing are connected to each other with the hinge, and the space is provided in the neighborhood of the hinge. The display device includes a first region overlapping with the first housing, a second region overlapping with the second housing, a third region overlapping with the space, and a fourth region overlapping with at least part of a side surface of the first housing.

Another embodiment of the present invention is an electronic device which includes a first housing, a second housing, a first hinge, a second hinge, a space, and a display device. In the electronic device, the first housing and the second housing are connected to each other with the first hinge, the first housing and the second housing are connected to each other with the second hinge, and the space includes a region sandwiched between the first hinge and the second hinge. The display device includes a first region overlapping with the first housing, a second region overlapping with the second housing, a third region overlapping with the space, and a fourth region overlapping with at least part of a side surface of the first housing.

In the above-described electronic device, the display device may further include a fifth region overlapping with at least part of a side surface of the second housing.

The above-described display device has flexibility. At least part of the third region is preferably positioned in the space when an angle between the first region and the second region is more than or equal to 0° and less than 80°; thus, breakage of the display device can be prevented. An inside diameter of the space is preferably more than or equal to 1 mm and less than or equal to 50 mm.

The above-described display device preferably include a first pixel and a second pixel. The first pixel is preferably configured to reflect visible light, and the second pixel is preferably configured to emit visible light.

The above-described electronic device is preferably configured to keep a relative angle between the first region and the second region at 160°±15°. Furthermore, the electronic device is preferably configured to keep a relative angle between the first region and the second region at 120°±15°.

One embodiment of the present invention can provide a display device, electronic device, or the like having favorable visibility. One embodiment of the present invention can provide a display device, electronic device, or the like having high display quality. One embodiment of the present invention can provide a display device, electronic device, or the like having high reliability. One embodiment of the present invention can provide a novel display device, electronic device, or the like.

Note that the descriptions of these effects do not disturb the existence of other effects. One embodiment of the present invention does not need to have all of these effects. Other effects will be apparent from and can be derived from the description of the specification, the drawings, the claims, and the like.

BRIEF DESCRIPTION OF THE DRAWINGS

In the accompanying drawings:

FIGS. 14A, 14B1, 14B2, 14B3, and 14B4 illustrate structure examples of a display device;

FIGS. 17A1, 17A2, 17B1, 17B2, 17C1, and 17C2 illustrate examples of using electronic devices in various display modes;

FIG. 22 illustrates a structure example of a display device;

FIGS. 27A and 27B are TEM images of samples and FIGS. 27C to 27L are electron diffraction patterns thereof.

DETAILED DESCRIPTION OF THE INVENTION

Figure 1A:
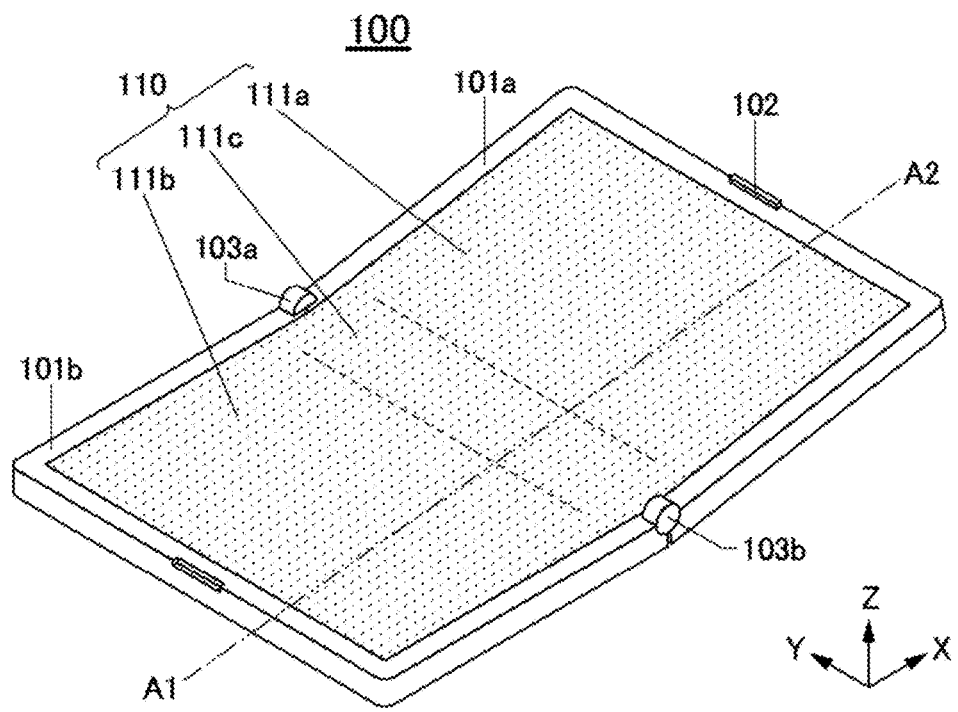
FIGS. 1A and 1B illustrate an electronic device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding of the present invention.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A different ordinal number from an ordinal number used to denote a component in this specification and the like might be used to denote the component in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" provided in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

In this specification, unless otherwise specified, the term "parallel" indicates that the angle formed between two straight lines is greater than or equal to −10° and less than or equal to 10°, and accordingly also includes the case where the angle is greater than or equal to −5° and less than or equal to 5°. In addition, unless otherwise specified, the term "substantially parallel" indicates that the angle formed between two straight lines is greater than or equal to −30° and less than or equal to 30°. The term "perpendicular" or "orthogonal" indicates, unless otherwise specified, that the angle formed between two straight lines is greater than or equal to 80° and less than or equal to 100°, and accordingly also includes the case where the angle is greater than or equal to 85° and less than or equal to 95°. In addition, unless otherwise specified, the term "substantially perpendicular" indicates that the angle formed between two straight lines is greater than or equal to 60° and less than or equal to 120°.

In this specification and the like, the terms "identical", "the same", "equal", "uniform", and the like (including synonyms thereof) used in describing calculation values and actual measurement values allow for a margin of error of ±20% unless otherwise specified.

Embodiment 1

Structure examples of an electronic device of one embodiment of the present invention are described with reference to drawings. Note that arrows indicating the X-axis direction, the Y-axis direction, and the Z-axis direction are illustrated in some of the drawings. The X-axis direction, the Y-axis direction, and the Z-axis direction are orthogonal to each other.

Structure Example of Electronic Device

Figure 1B:
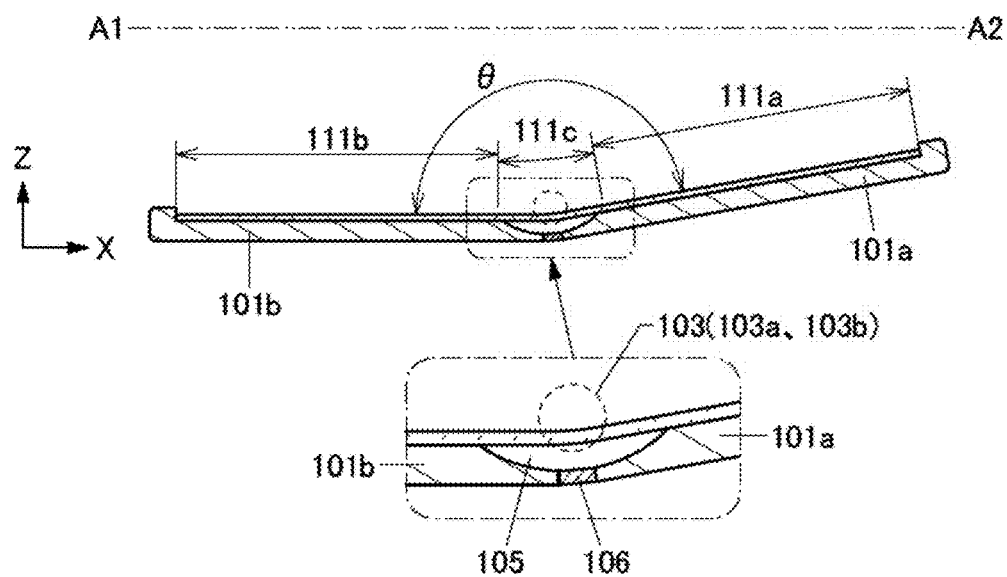
Figure 2A:
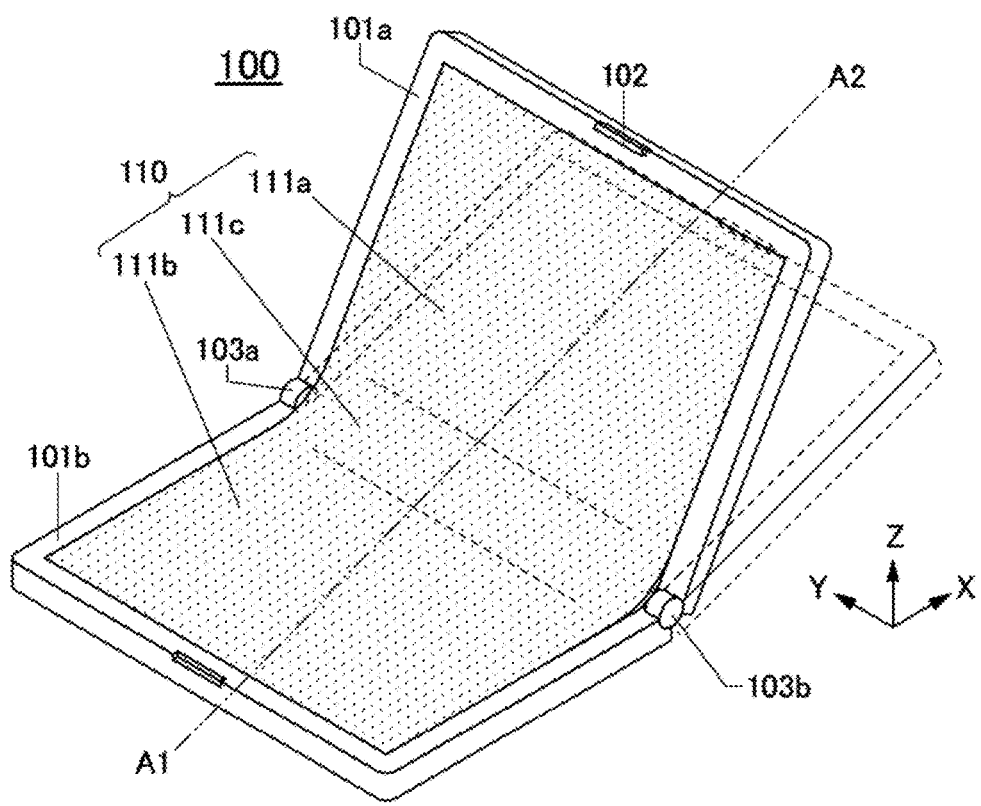
FIGS. 2A and 2B illustrate an electronic device.
Figure 2B:
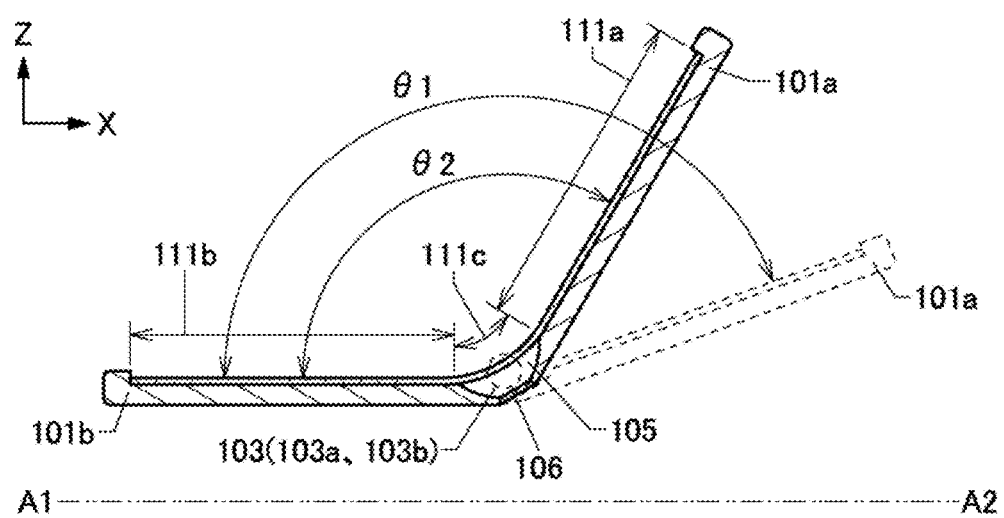

FIG. 1A and FIG. 2A are perspective views each illustrating an appearance of an electronic device 100. FIG. 1B is a cross-sectional view taken along a dashed-dotted line A1-A2 in FIG. 1A. FIG. 2B is a cross-sectional view taken along a dashed-dotted line A1-A2 in FIG. 2A. Note that FIG. 1B and FIG. 2B are the cross-sectional views of the electronic device 100 seen from the Y-axis direction.

The electronic device 100 includes a housing 101a, a housing 101b, a fixing portion 102, a hinge 103a, a hinge 103b, a region 105 (a first space), and a display device 110.

In this specification and the like, the housing 101a and the housing 101b are collectively referred to as "a housing 101" in some cases. Furthermore, in this specification and the like, the hinge 103a and the hinge 103b are collectively referred to as "a hinge 103" in some cases.

The housing 101a and the housing 101b are connected to each other with the hinge 103a. The housing 101a and the housing 101b are connected with the hinge 103b. The relative angle between the housing 101a and the housing 101b can be changed by using the hinge 103 as an axis. Specifically, the housing 101a and the housing 101b can rotate about an imaginary line that connects the hinge 103a and the hinge 103b, so that the relative angle between the housing 101a and the housing 101b can be changed. In other words, the hinge 103 serves as a rotation axis.

Moreover, the housing 101a and the housing 101b are connected to each other with a structure body 106 (see FIG. 1B). As the structure body 106, an elastic material is used. For example, a material with a high Young's modulus of higher than or equal to $1\times10^5$ Pa and lower than or equal to $5\times10^7$ Pa is used. For example, an elastic material such as rubber may be used as the structure body 106.

Furthermore, the electronic device 100 includes the region 105 in the neighborhood of the hinge 103. The region 105 is surrounded by the housing 101a, the housing 101b, the structure body 106, and the display device 110. In addition, the region 105 includes a region sandwiched between the hinge 103a and the hinge 103b. Alternatively, the region 105 may include a region sandwiched between the hinge 103a and the hinge 103b.

The display device 110 has flexibility. The display device 110 includes a display region 111a overlapping with the housing 101a, a display region 111b overlapping with the housing 101b, and a display region 111c overlapping with the region 105.

In the display region 111c of the display device 110, the length of the region 105 in the Y-axis direction is longer than or equal to the length of the display device 110 in the Y-axis direction. In addition, along the Y-axis direction of the display region 111c, there is a region where the display device 110 and the region 105 completely overlap with each other. In other words, the region 105 crosses the display device 110 in the Y-axis direction.

When the relative angle between the housing 101a and the housing 101b is changed, the display region 111c bends or extends. In other words, by bending or extending the display region 111c, an angle θ which is the relative angle between the display region 111a and the display region 111b can be changed. A change in the angle θ changes the shape of the region 105. Note that FIG. 2A is the perspective view illustrating an appearance of the electronic device 100 in the state where the angle θ is changed.

In the electronic device 100 described in this embodiment, the display region 111c bends and forms a curved surface, while the display region 111a and the display region 111b keep their flatness and do not change their shapes. In this specification and the like, a surface whose shape is not changed (e.g., a surface that remains flat) is referred to as a "flat surface". Accordingly, the display region 111a and the display region 111b are referred to as flat surfaces, in some cases.

As at least one of the hinge 103a and the hinge 103b, a hinge having a mechanism that enables the angle θ to be kept at a specific angle temporarily (also referred to as "a click hinge") is preferably used.

For example, as illustrated in FIG. 2B, a click hinge capable of temporarily keeping the angle θ at an angle θ1 and an angle θ2 is used. The angle θ1 and the angle θ2 may be determined in accordance with the purpose or the intended use. For example, the angle θ1 is set to be in the neighborhood of 160°, and the angle θ2 is set to be in the neighborhood of 120°. Note that the neighborhood of 160° includes a range of 160°±15°. In other words, the angle θ1 is more than or equal to 145° and less than 175°. Furthermore, the neighborhood of 120° includes a range of 120°±15°. In other words, the angle θ2 is more than or equal to 105° and less than 135°.

Figure 3A:
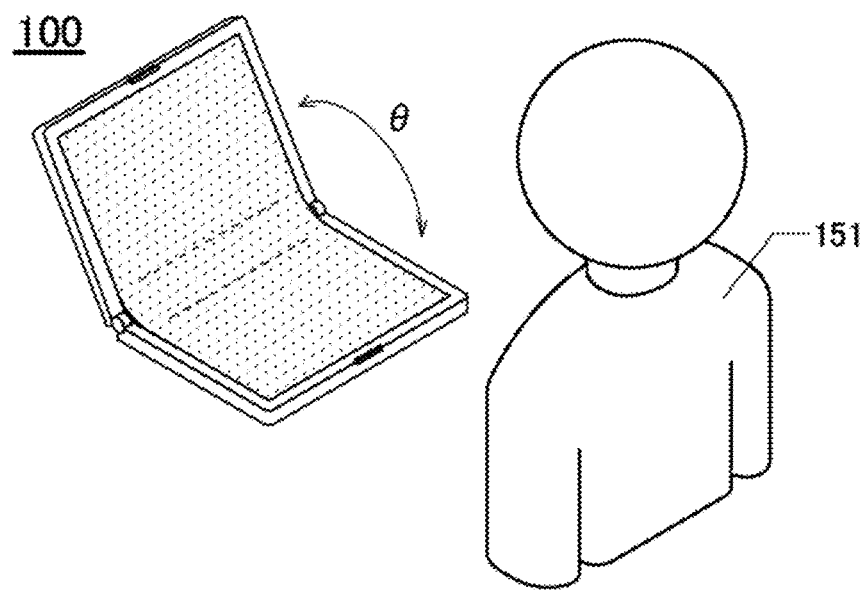
FIGS. 3A and 3B illustrate examples of using an electronic device.
Figure 3B:
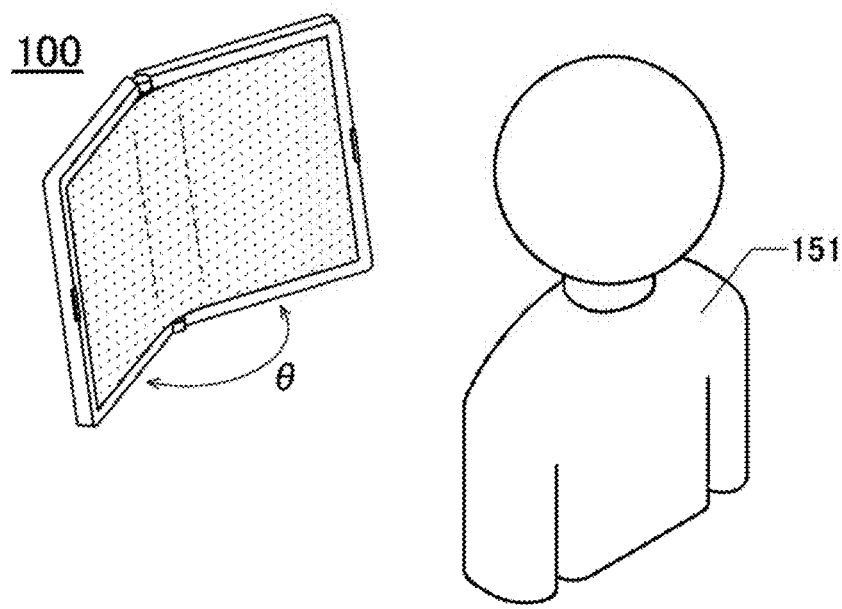

FIGS. 3A and 3B illustrate examples in which a user 151 uses the electronic device 100. In FIG. 3A, the user 151 uses the electronic device 100 in the state where the housing 101a and the housing 101b are vertically arranged. In FIG. 3B, the user 151 uses the electronic device 100 in the state where the housing 101a and the housing 101b are arranged side by side. By using the click hinge as the hinge 103, the angle θ can be kept constant regardless of the orientation of the electronic device 100.

Furthermore, when using the click hinge as the hinge 103, the user 151 does not have to work on to keep the angle θ constant; accordingly, fatigue caused by using the electronic device 100 can be reduced. Furthermore, the operability of the electronic device 100 can be increased. Moreover, the visibility of the electronic device 100 can be increased.

As at least one of the hinges 103a and 103b, a hinge having a mechanism that enables the angle θ to be temporarily kept at a desired angle (also referred to as "a torque hinge") may be used. By using the torque hinge, the angle θ can be kept at an angle that the user 151 desires.

Figure 4A:
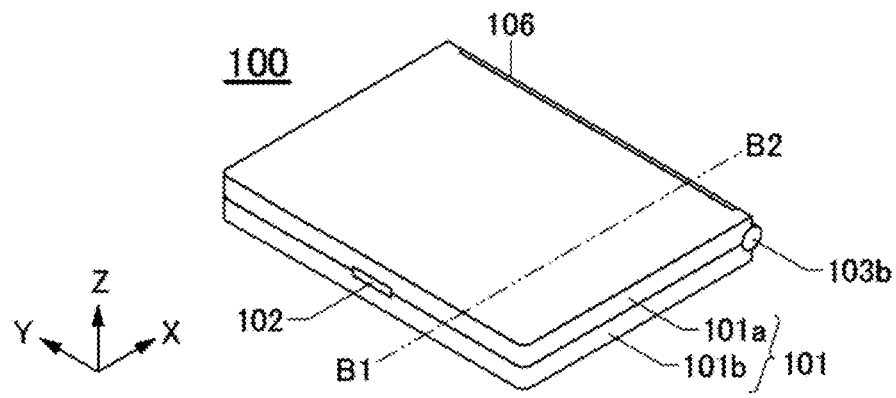
FIGS. 4A to 4C illustrate an electronic device.
Figure 4B:
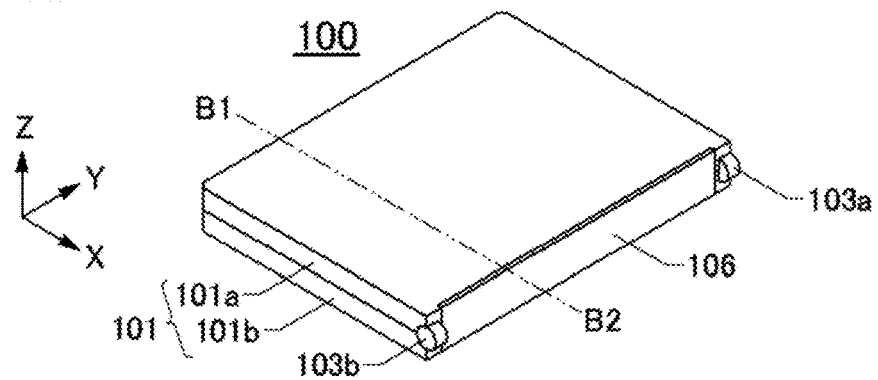
Figure 4C:
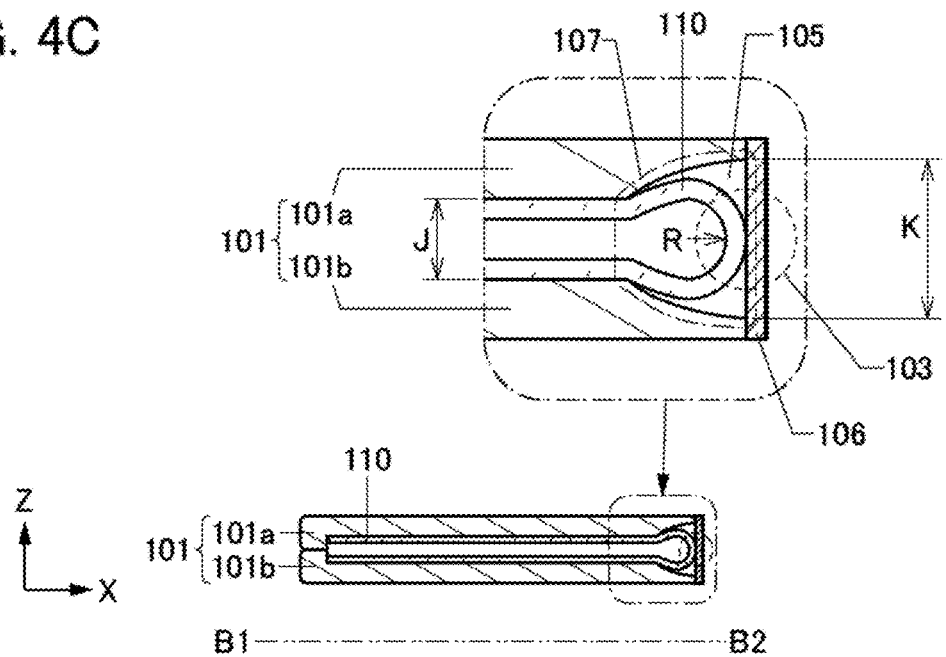

FIG. 4A and FIG. 4B are perspective views each illustrating an appearance of the electronic device 100. FIG. 4C is a cross-sectional view taken along a dashed-dotted line B1-B2 in FIGS. 4A and 4B. Note that FIG. 4C is the cross-sectional view of the electronic device 100 seen from the Y-axis direction.

FIG. 4A is the perspective view of the electronic device 100 in the state where the housing 101a and the housing 101b overlap with each other so that the display region 111a and the display region 111b of the display device 110 face each other. This state is also referred to as the closed state of the electronic device 100. Furthermore, in FIG. 4A, the housing 101a and the housing 101b are fixed with the fixing portion 102.

Note that depending on the purposes or the like, the fixing portion 102 is not provided. For example, when the above-described click hinge or torque hinge is used as at least one of the hinges 103a and 103b, the fixing portion 102 may be omitted. The omission of the fixing portion 102 can increase the productivity of the electronic device 100.

When the electronic device 100 is in the closed state, a region 107 (a second space) sandwiched between the housing 101a and the housing 101b is formed. The region 105 and part of the display device 110 are included in the region 107. Furthermore, in the region 107, a maximum distance K between the housing 101a and the housing 101b is larger than a distance J which is the length from the housing 101a overlapping with the display region 111a to the housing 101b overlapping with the display region 111b (see FIG. 4C).

In the closed state of the electronic device 100, the display device 110 is bent so as to face inward. Thus, in the closed state of the electronic device 100, the display region 111a and the display region 111b of the display device 110 overlap with each other and at least part of the display region 111c bends. At this time, if a radius of curvature R of the bent portion is too small, the display region 111c might be damaged and a problem such as a crack might occur. Thus, an excessively small radius of curvature R can cause a reduction in the display quality and/or reliability of the display device 110, for example. Moreover, the function of the display device 110 can be lost.

In the electronic device 100 of one embodiment of the present invention, as the angle θ is smaller, the shape of the region 105 changes, and the bent portion of the display region 111c and the structure body 106 become close to each other. The radius of curvature R of the bent portion is the smallest when the electronic device 100 is in the closed state. By the change in shape of the region 105, the radius of curvature R can be prevented from becoming too small. Note that a structure body, a filler, or the like may be provided in the region 105. For example, a cushioning material or the like that for supporting the bent portion of the display region 111c may be provided in the region 105.

The radius of curvature R is preferably more than or equal to 1 mm and less than or equal to 50 mm, preferably more than or equal to 5 mm and less than or equal to 50 mm. When the radius of curvature R is set to be more than or equal to 1 mm, further preferably more than or equal to 5 mm in the closed state of the electronic device 100, damage to the bent portion can be reduced, so that the display quality and/or reliability of the display device 110 can become favorable.

Furthermore, once the angle θ becomes larger than the neighborhood of 180°, the bent portion of the display region 111c might move toward the far side from the structure body 106 the next time the angle θ becomes small. In this case, when the angle θ becomes further smaller, the display device 110 might be broken. In order that the bent portion of the display region 111c and the structure body 106 can reliably come close to each other, the maximum value of the angle θ is preferably less than 180°, further preferably less than 175°.

Bending the display portion (the display device 110) so that it faces inward to close the electronic device 100 can protect the display portion.

In a region where the housing 101 and the display device 110 do not overlap with each other, at least part of the housing 101 is preferably located higher than a surface of the display device 110. This can prevent the contact between the display region 111a and the display region 111b of the display device 110 in the closed state of the electronic device 100, making the display quality and/or reliability of the display device 110 favorable.

Moreover, the structure body 106 extends depending on the angle θ (see FIG. 1B, FIG. 2B, and FIG. 4C). In the closed state of the electronic device 100, the structure body 106 extends the most. The structure body 106 has a function of protecting the display device 110 so that a non-display surface of the display device 110 is not exposed to the outside.

Figure 5A:
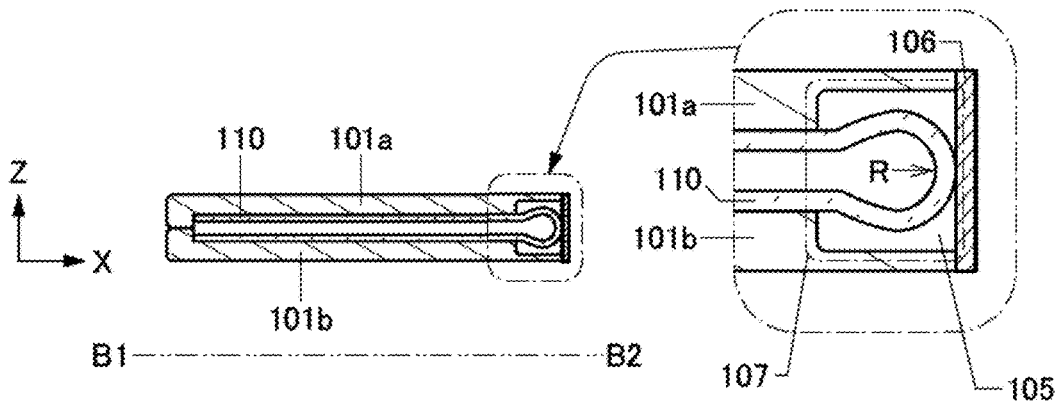
FIGS. 5A to 5C each illustrate an electronic device.
Figure 5B:
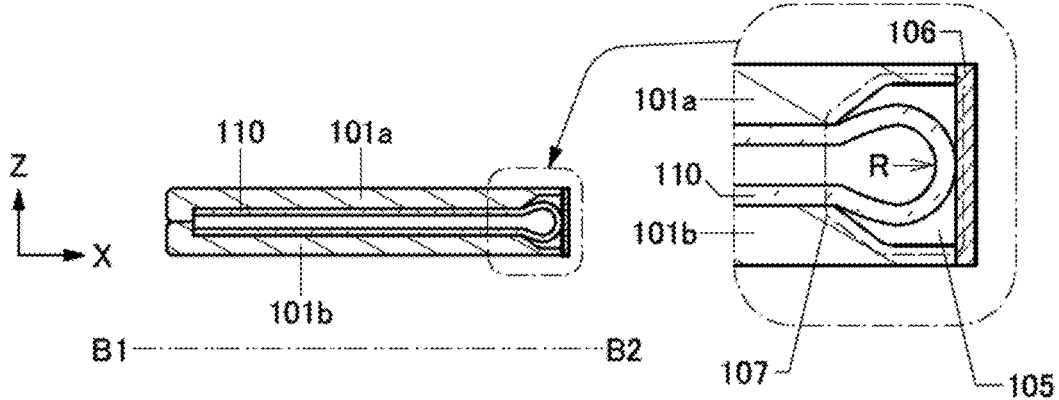

The cross-sectional shape of the region 107 when seen from the Y-axis direction may be a circular shape, an elliptic shape, or a rectangular shape (see FIG. 5A). The cross-sectional shape of the region 107 may have a tapered portion (see FIG. 5B).

Figure 5C:
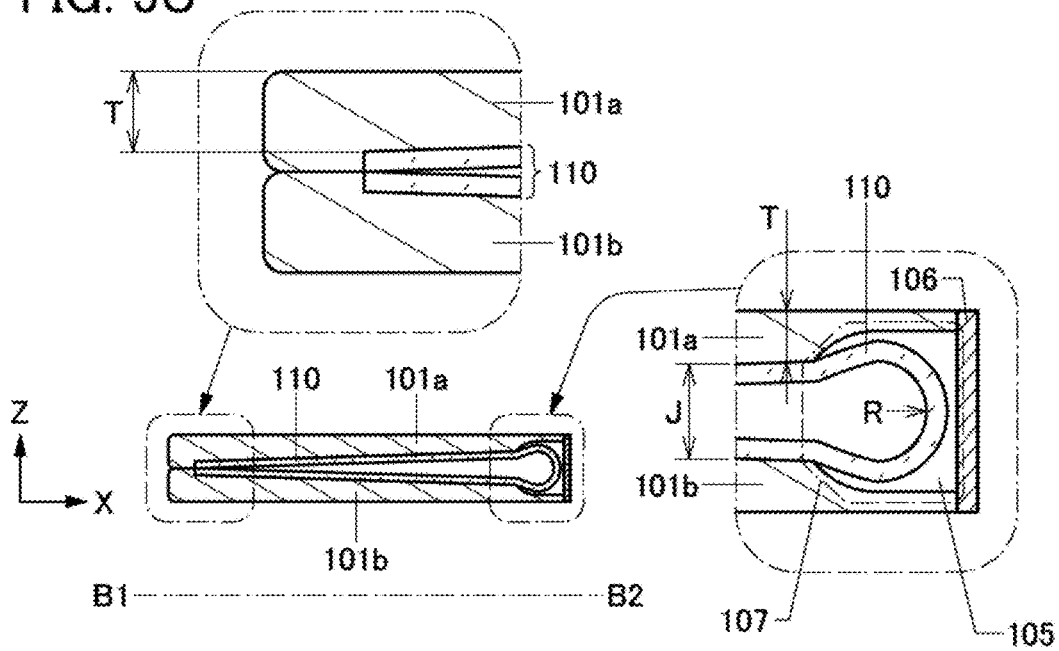

In the cross section of the housing 101a, a thickness T of the housing 101a in a region overlapping with the display region 111a may decrease toward the region 105. In the cross section of the housing 101b, the thickness T of the housing 101b in a region overlapping with the display region 111b may decrease toward the region 105. Alternatively, the distance J may increase toward the region 105 (see FIG. 5C). Such a shape of the housing 101 can prevent the angle θ from becoming more than or equal to the neighborhood of 180°.

Figure 6A:
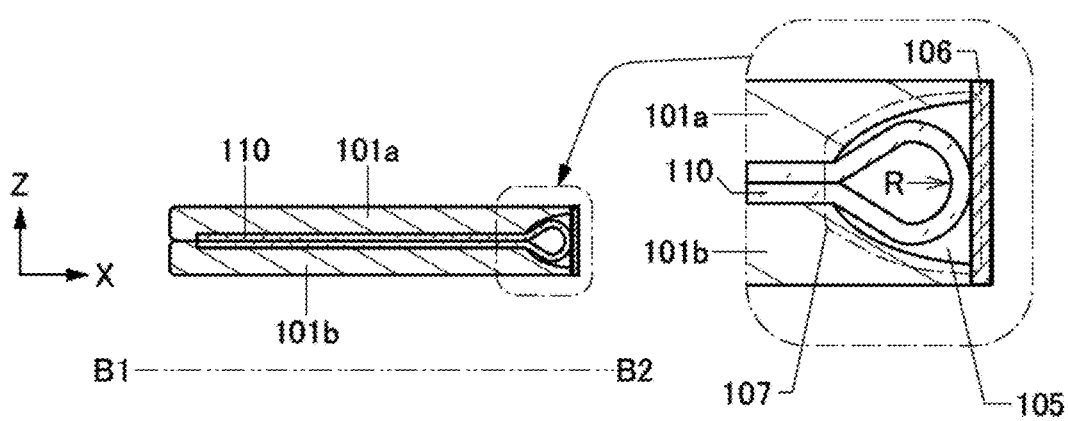
FIGS. 6A and 6B each illustrate an electronic device.

Depending on the case, the display region 111a and the display region 111b of the display device 110 may be partly in contact with each other when the electronic device 100 is closed (see FIG. 6A).

Figure 6B:
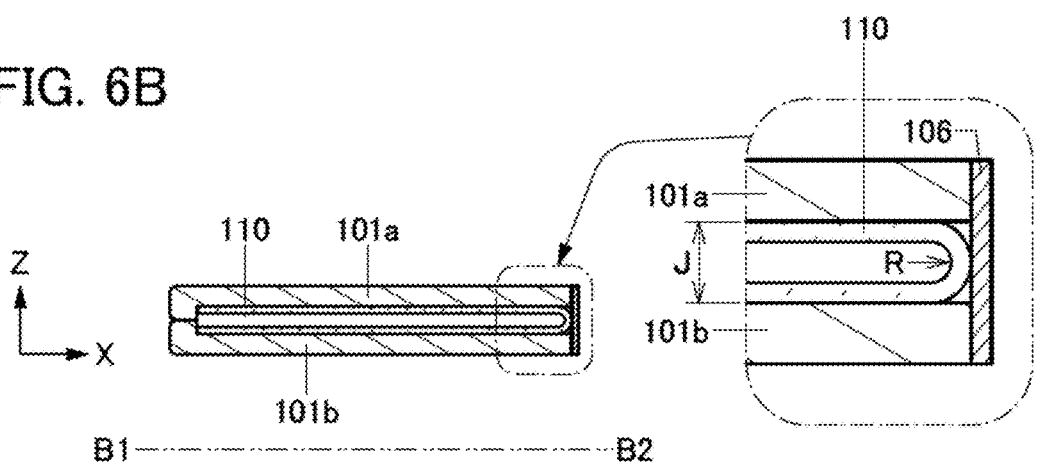

Furthermore, depending on the size or the like of the electronic device 100, a necessary radius of curvature R can be obtained by the distance J. In such a case, the region 105 can be omitted in some cases (see FIG. 6B).

Figure 7A:
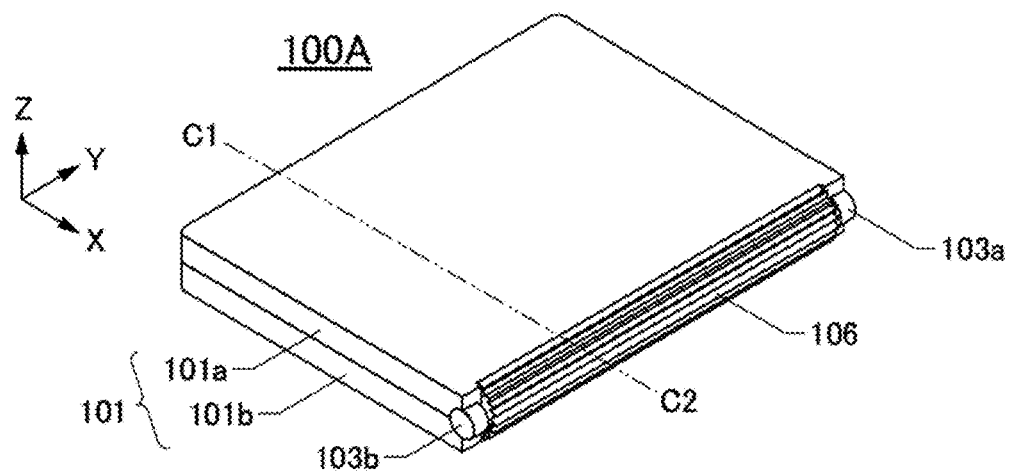
FIGS. 7A and 7B illustrate an electronic device.
Figure 7B:
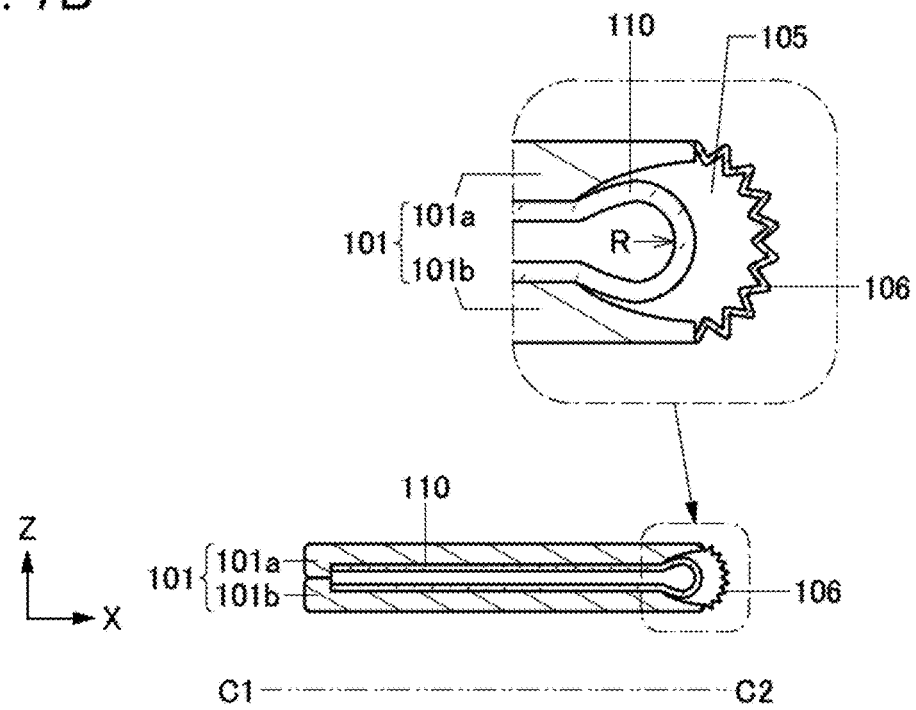

FIG. 7A is a perspective view illustrating an appearance of an electronic device 100A. FIG. 7B is a cross-sectional view seen from the Y-axis direction and taken along a dashed-dotted line C1-C2 in FIG. 7A.

The electronic device 100A is similar in structure to the electronic device 100 except the structure body 106. The electronic device 100A includes the structure body 106 having a pleated shape. By setting the structure body 106 into a pleated shape, a material that hardly extends can be used as the structure body 106.

Figure 8A:
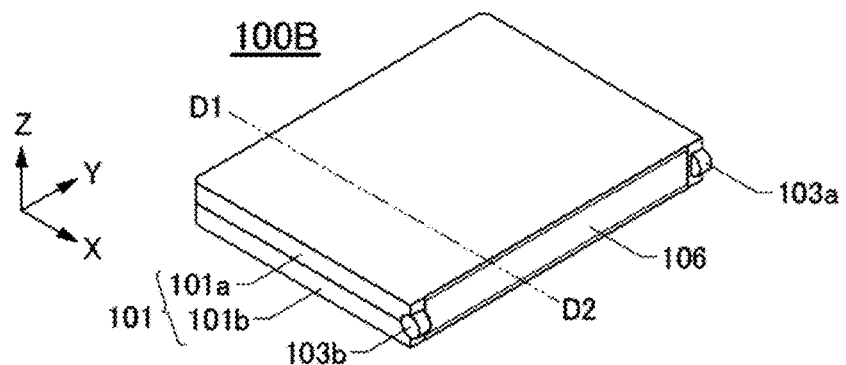
FIGS. 8A to 8C illustrate an electronic device.
Figure 8B:
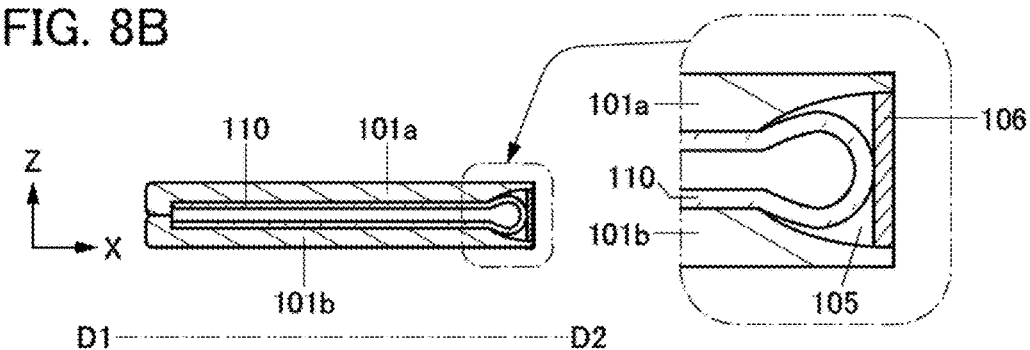
Figure 8C:
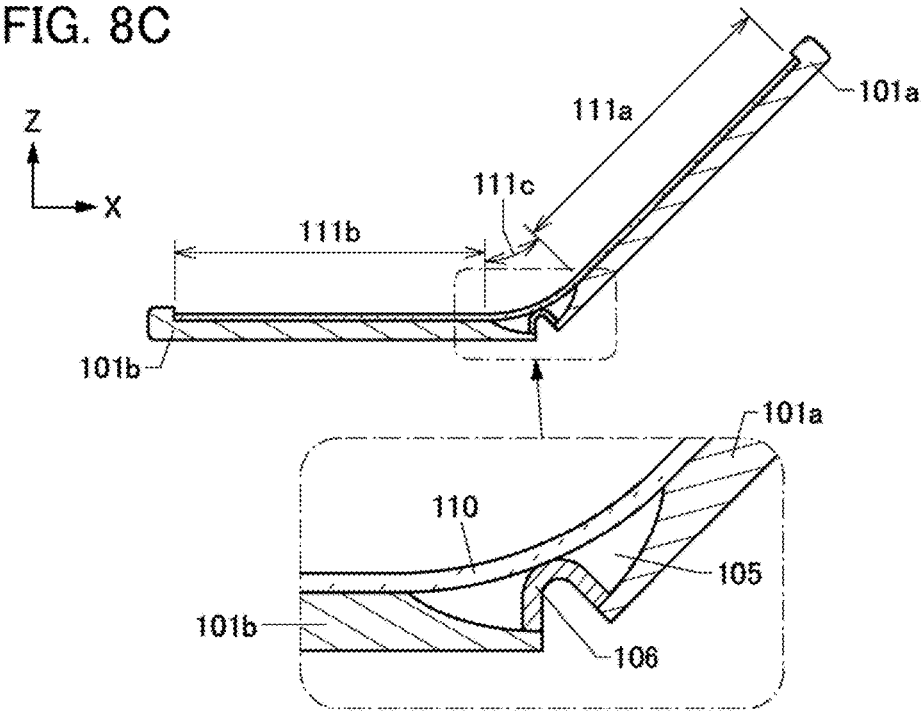

FIG. 8A is a perspective view illustrating an appearance of an electronic device 100B. FIG. 8B is a cross-sectional view seen from the Y-axis direction and taken along a dashed-dotted line D1-D2 in FIG. 8A. FIG. 8C is a cross-sectional view illustrating a state in which the electronic device 100B is open.

The electronic device 100B is similar in structure to the electronic device 100 but is different in that the structure body 106 changes in shape when the electronic device 100B is open. In FIG. 8B, the structure body 106 is provided so as to be sandwiched between the housing 101a and the housing 101b when the electronic device 100B is closed. Note that the structure body 106 may be provided as in the electronic device 100.

As the electronic device 100B is opened, the structure body 106 changes its shape so as to project toward the display device 110 more. In FIG. 8C, the shape-changed structure body 106 is in contact with the display device 110. Thus, the structure body 106 whose shape has been changed has an effect of supporting the display region 111c of the display device 110. In the case where a touch sensor or the like is provided so as to overlap with the display device 110 or where a touch sensor or the like is provided in the display device 110, the structure body 106 can support the display region 111c of the display device 110, so that touch input or the like in the display region 111c can be facilitated.

Other Hardware Structure Example

Figure 9:
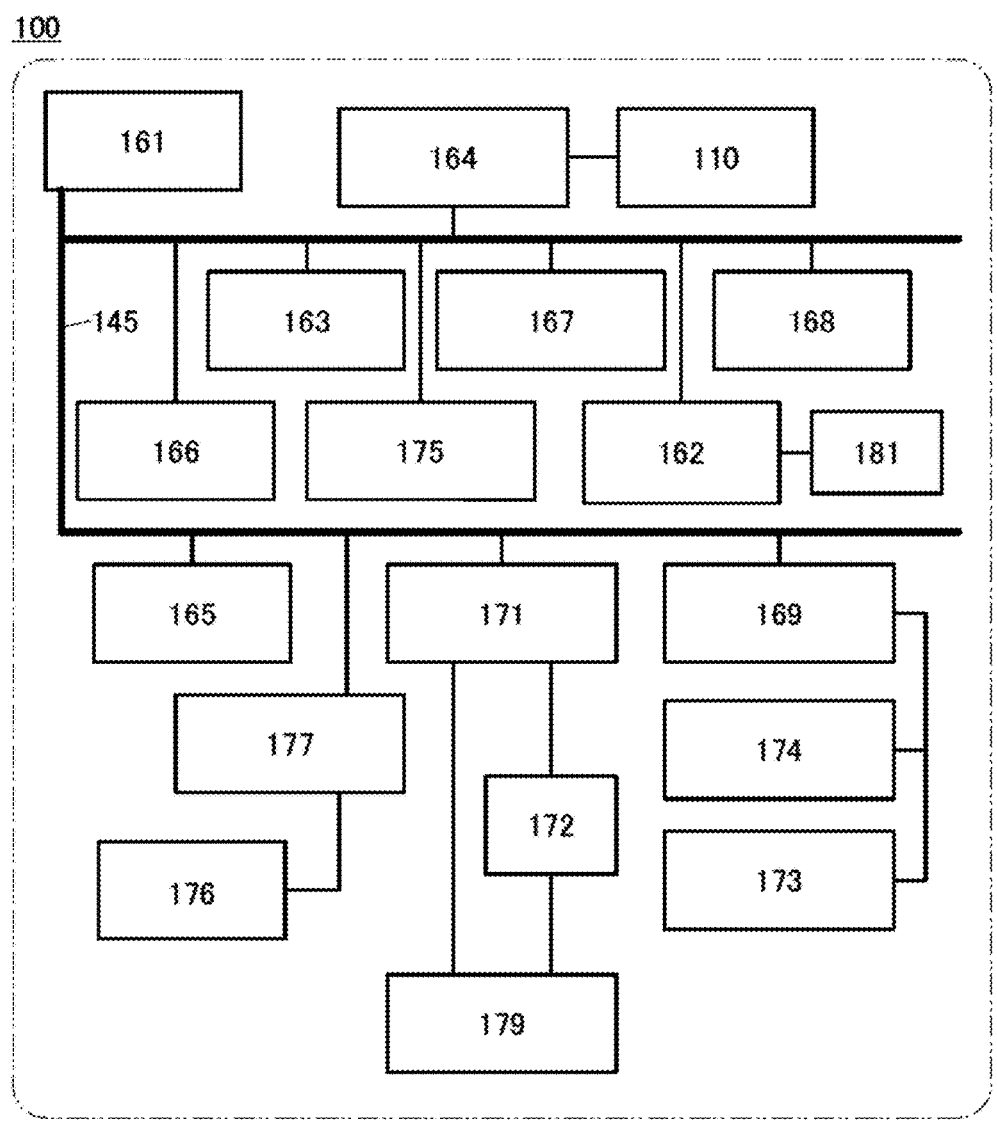
FIG. 9 is a block diagram illustrating a structure example of an electronic device.

A hardware structure example that can be applied to the electronic device 100 will be described below. FIG. 9 is a block diagram illustrating a structure example that can be applied to the electronic device 100.

Although a block diagram attached to this specification shows elements classified according to their functions in independent blocks, it may be practically difficult to completely separate the elements according to their functions and, in some cases, one element may be involved in a plurality of functions, or a plurality of elements may be involved in one function.

The structure of the electronic device 100 illustrated in FIG. 9 is a mere example, and the electronic device 100 does not need to include all the components. The electronic device 100 includes necessary components among the components illustrated in FIG. 9 and may include a component other than the components in FIG. 9.

The electronic device 100 can include the display device 110, an arithmetic device 161, a touch sensor 176, a memory device 163, a display portion control device 164, a touch sensor controller 177, a battery controller 171, a power reception portion 172, a battery 179, a sound controller 169, an audio input device 174, an audio output device 173, a communication device 162, an antenna 181, an orientation determination portion 165, an external interface 168, an imaging device 175, a vibration device 166, a sensor module 167, and the like.

The memory device 163, the display portion control device 164, the touch sensor controller 177, the battery controller 171, the sound controller 169, the communication device 162, the orientation determination portion 165, the external interface 168, the imaging device 175, the vibration device 166, the sensor module 167, and the like are each connected to the arithmetic device 161 through a bus line 145.

The touch sensor 176 may overlap with the display device 110. The display device 110 may have a function of the touch sensor 176.

The arithmetic device 161 can function as, for example, a central processing unit (CPU). The arithmetic device 161 has a function of controlling components such as the touch sensor controller 177, the battery controller 171, the sound controller 169, the communication device 162, the orientation determination portion 165, the external interface 168, the imaging device 175, the vibration device 166, and the sensor module 167. The arithmetic device 161 may have functions of the memory device 163, the display portion control device 164, and the like.

Signals are transmitted between the arithmetic device 161 and the components via the bus line 145. The arithmetic device 161 has a function of processing signals input from the components which are connected through the bus line 145, a function of generating signals to be output to the components, and the like, so that the components connected to the bus line 145 can be controlled comprehensively.

Note that a transistor that includes an oxide semiconductor, which is one type of a metal oxide, in a semiconductor layer where a channel is formed and that has an extremely low off-state current can be used in an IC or the like included in the arithmetic device 161 or another component. With the use of the transistor having an extremely low off-state current as a switch for holding electric charge (data) which flows into a capacitor serving as a memory element, a long data retention period can be ensured. By utilizing this characteristic for a register or a cache memory of the arithmetic device 161, normally-off computing is achieved where the arithmetic device 161 operates only when needed and data on the previous processing is stored in the memory element in the rest of time; thus, power consumption of the electronic device 100 can be reduced.

The arithmetic device 161 interprets and executes instructions from various programs with a processor to process various kinds of data and control programs. The programs that can be executed by the processor may be stored in a memory region of the processor or in the memory device 163.

A CPU and another microprocessor such as a digital signal processor (DSP) or a graphics processing unit (GPU) can be used alone or in combination as the arithmetic device 161. Furthermore, such a microprocessor may be obtained with a programmable logic device (PLD) such as a field programmable gate array (FPGA) or a field programmable analog array (FPAA).

The arithmetic device 161 may include a main memory. The main memory can include a volatile memory, such as a random access memory (RAM), and a nonvolatile memory, such as a read only memory (ROM).

For example, a dynamic random access memory (DRAM) is used for the RAM included in the main memory, in which case a memory space as a workspace for the arithmetic device 161 is virtually allocated and used. An operating system, an application program, a program module, program data, and the like which are stored in the memory device 163 are loaded into the RAM and executed. The data, program, and program module which are loaded into the RAM are directly accessed and operated by the arithmetic device 161.

In the ROM, a basic input/output system (BIOS), firmware, and the like for which rewriting is not needed can be stored. As the ROM, a mask ROM, a one-time programmable read only memory (OTPROM), or an erasable programmable read only memory (EPROM) can be used. As an EPROM, an ultra-violet erasable programmable read only memory (UV-EPROM) which can erase stored data by irradiation with ultraviolet rays, an electrically erasable programmable read only memory (EEPROM), a flash memory, and the like can be given.

Examples of the memory device 163 are a memory device including a nonvolatile memory element, such as a flash memory, a magnetoresistive random access memory (MRAM), a phase change RAM (PRAM), a resistive RAM (ReRAM), or a ferroelectric RAM (FeRAM); a memory device including a volatile memory element, such as a dynamic RAM (DRAM) or a static RAM (SRAM); and the like. Furthermore, a memory media drive such as a hard disk drive (HDD) or a solid state drive (SSD) may be used.

As the memory device 163, a memory device which can be connected and disconnected through the external interface 168 with a connector, such as an HDD or an SSD; or a memory media drive, such as a flash memory, a Blu-ray disc, or a DVD can be used. Note that the memory device 163 is not necessarily incorporated in the electronic device 100, and a memory device outside the electronic device 100 may be used as the memory device 163. In that case, the memory device may be connected through the external interface 168, or data transmission and reception may be wirelessly performed using the communication device 162.

The display portion control device 164 is connected to the arithmetic device 161 through the bus line 145. The display portion control device 164 is connected to the display device 110. The display portion control device 164 has a function of controlling the display device 110 according to drawing instructions input from the arithmetic device 161 so that the display device 110 displays a predetermined image.

The touch sensor 176 is connected to the touch sensor controller 177. The touch sensor controller 177 is connected to the arithmetic device 161 through the bus line 145.

The touch sensor controller 177 controls the touch sensor 176 according to requests from the arithmetic device 161 via the bus line 145. In addition, the touch sensor controller 177 outputs a signal received by the touch sensor to the arithmetic device 161 via the bus line 145. Note that the function of calculating touch position data from a signal received by the touch sensor may be given to the touch sensor controller 177 or the arithmetic device 161.

The touch sensor 176 is capable of sensing the proximity or touch of an object to be sensed, such as a finger or a stylus, in accordance with a signal supplied from the touch sensor controller 177 and outputting the positional information on the object to the touch sensor controller 177.

The touch sensor 176 and the touch sensor controller 177 preferably have a function of obtaining the distance between a sensing surface and the object in the height direction, a function of obtaining the level of pressure applied to the sensing surface by the object, and a function of obtaining the size of the surface of the sensing surface that is in contact with the object.

A module including the touch sensor 176 can be provided on the display surface side of the display panel so as to overlap with the display panel. In that case, at least a portion of the module including the touch sensor is preferably flexible to follow the bending of the display panel. The module including the touch sensor can be bonded to the display panel with an adhesive or the like. A polarizing plate or a cushion material (e.g., a separator) may be provided between the module and the display panel. The thickness of the module including the touch sensor is preferably smaller than or equal to that of the display panel.

A touch panel in which a display device and a touch sensor are combined may be used as the touch sensor 176. For example, an on-cell touch panel or an in-cell touch panel is preferable. The on-cell or in-cell touch panel can be thin and lightweight. The on-cell or in-cell touch panel has fewer components and can therefore reduce cost.

A variety of sensors that can sense proximity or touch of a sensing target such as a finger can be used as the touch sensor 176. For example, a sensor of a capacitive type, a resistive type, an ultrasonic surface acoustic wave type, an acoustic pulse recognition type, an infrared type, an electromagnetic induction type, an optical type, or the like can be used. Alternatively, an optical sensor using a photoelectric conversion element, a pressure-sensitive sensor using a pressure-sensitive element, or the like may be used. Sensors of two or more different types may be included, or two or more sensors of the same type may be included.

For example, a capacitive touch sensor includes a pair of conductive layers. The pair of conductive layers is capacitively coupled. The capacitance between the pair of conductive layers changes when an object touches, presses, or approaches the pair of conductive layers. Utilizing this effect, detection can be conducted.

Examples of the capacitive touch sensor include a surface capacitive touch sensor and a projected capacitive touch sensor. Examples of the projected capacitive touch sensor are a self-capacitive touch sensor and a mutual capacitive touch sensor, which differ mainly in the driving method. The use of a mutual capacitive type is preferable because multiple points can be easily sensed simultaneously.

The battery controller 171 can manage a charge state of the battery 179. In addition, the battery controller 171 supplies power from the battery 179 to the components. The power reception portion 172 has a function of receiving power supplied from the outside and charging the battery 179. The battery controller 171 can control the operation of the power reception portion 172 depending on the charge state of the battery 179.

The battery 179 includes one or more primary batteries or secondary batteries, for example. Examples of the secondary battery which can be used for the battery 179 include a lithium-ion secondary battery and a lithium-ion polymer secondary battery. In addition to such a battery, the battery 179 may be provided with a protection circuit for preventing overcharge and overdischarge of the battery.

In the case of indoor use or the like, an alternating-current (AC) power supply may be used as an external power supply. Particularly in the case of using the electronic device 100 separately from the external power supply, it is favorable that the battery 179 have a large charge/discharge capacity which allows the electronic device 100 to be used for a long time. The battery 179 may be charged using a battery charger capable of supplying power to the electronic device 100. At this time, charging may be performed through wires using a universal serial bus (USB) connector, an AC adaptor, or the like; alternatively, charging may be performed by a wireless power feeding method such as an electric field coupling method, an electromagnetic induction method, or an electromagnetic resonance (electromagnetic resonant coupling) method.

The battery controller 171 may include a battery management unit (BMU), for example. The BMU collects data on cell voltage or cell temperatures of the battery, monitors overcharge and overdischarge, controls a cell balancer, handles a deterioration state of the battery, calculates the remaining battery power level (state of charge: SOC), and controls detection of a failure, for example.

The battery controller 171 controls power transmission from the battery 179 to the components through a power supply line (not illustrated). The battery controller 171 can include a power converter with a plurality of channels, an inverter, a protection circuit, and the like.

When the housing 101 in which the battery 179 is incorporated is flexible and can be used in a bent state, it is preferable that the battery 179 be also at least partly flexible. Examples of the secondary battery which can be used for the battery 179 include a lithium-ion secondary battery and a lithium-ion polymer secondary battery. It is preferable that a laminate pouch be used as an exterior package of the battery so that the battery has flexibility.

A film used for the laminate pouch is a single-layer film selected from a metal film (such as aluminum, stainless steel, or nickel steel), a plastic film made of an organic material, a hybrid material film containing an organic material (e.g., an organic resin or fiber) and an inorganic material (e.g., ceramic), and a carbon-containing inorganic film (e.g., a carbon film or a graphite film), or a stacked-layer film including two or more of the above films. A metal film can be easily embossed. Forming depressions or projections by embossing increases the surface area of the film exposed to outside air, achieving efficient heat dissipation.

It is particularly preferable that a laminate pouch including a metal film having depressions and projections by embossing be used, in which case a strain caused by stress applied to the laminate pouch can be relieved, leading to an effective decrease of defects such as a break of the laminate pouch due to bending of a secondary battery.

The battery controller 171 preferably has a function of reducing power consumption. For example, after detection of no input to the electronic device 100 for a given period, the battery controller 171 lowers clock frequency or stops input of clocks of the arithmetic device 161, stops operation of the arithmetic device 161 itself, stops operation of the auxiliary memory, and reduces power consumption by reducing power supply to the components. Such a function can be performed with the battery controller 171 alone or the battery controller 171 interlocking with the arithmetic device 161.

The audio input device 174 includes a microphone (mike), an audio input connector, or the like. The audio output device 173 includes a speaker, an audio output connector, or the like. The audio input device 174 and the audio output device 173 are each connected to the sound controller 169 and connected to the arithmetic device 161 via the bus line 145. Audio data input to the audio input device 174 is converted into a digital signal in the sound controller 169 and then processed in the sound controller 169 and the arithmetic device 161. The sound controller 169 generates an audio signal audible to a user according to instructions from the arithmetic device 161 and outputs the audio signal to the audio output device 173. To the audio output connector of the audio output device 173, an audio output device such as earphones, headphones, or a headset can be connected and a sound generated in the sound controller 169 is output to the device.

The communication device 162 can communicate via the antenna 181. For example, the communication device 162 controls a control signal for connecting the electronic device 100 to a computer network according to instructions from the arithmetic device 161 and transmits the signal to the computer network. Accordingly, communication can be performed by connecting the electronic device 100 to a computer network such as the Internet (which is an infrastructure of the World Wide Web (WWW)), an intranet, an extranet, a personal area network (PAN), a local area network (LAN), a campus area network (CAN), a metropolitan area network (MAN), a wide area network (WAN), or a global area network (GAN). When a plurality of communication methods are used, the electronic device 100 may have a plurality of antennas 181 for the communication methods.

For example, a high frequency circuit (an RF circuit) is included in the communication device 162 for receiving and transmitting an RF signal. The RF circuit performs conversion between an electromagnetic signal and an electric signal in a frequency band which is set by a national law, and performs communication with another communication device wirelessly with the use of the electromagnetic signal. Several tens of kilohertz to several tens of gigahertz are a practical frequency band which is generally used. The RF circuit connected to the antenna 181 includes a high-frequency circuit portion which is compatible with a plurality of frequency bands; the high-frequency circuit portion can include an amplifier, a mixer, a filter, a DSP, an RF transceiver, or the like. In the case of performing wireless communication, it is possible to use, as a communication protocol or a communication technology, a communications standard such as Long Term Evolution (LTE), Global System for Mobile Communication (GSM) (registered trademark), Enhanced Data Rates for GSM Evolution (EDGE), Code Division Multiple Access 2000 (CDMA2000), or Wideband Code Division Multiple Access (W-CDMA) (registered trademark), or a communications standard developed by IEEE such as Wi-Fi (registered trademark), Bluetooth (registered trademark), or ZigBee (registered trademark).

The communication device 162 may have a function of connecting the electronic device 100 to a telephone line. In the case of a phone call through a telephone line, the communication device 162 controls a connection signal according to instructions from the arithmetic device 161 and transmits the signal to the telephone line. The connection signal is a signal for connecting the electronic device 100 to the telephone line.

The communication device 162 may include a tuner for generating a video signal from airwaves received by the antenna 181. The video signal is output to the display device 110. The tuner includes, for example, a demodulation circuit, an AD converter circuit (analog-digital converter circuit), a decoder circuit, and the like. The demodulation circuit has a function of demodulating a signal input from the antenna 181. The AD converter circuit has a function of converting the demodulated analog signal into a digital signal. The decoder circuit has a function of decoding video data contained in the digital signal and generating a signal to be transmitted to the display portion control device 164.

The decoder may include a dividing circuit and a plurality of processors. The dividing circuit has a function of dividing the input video data spatiotemporally and outputting it to the processors. The plurality of processors decode the input video data and generate signals to be transmitted to the display portion control device 164. Since the decoder includes the plurality of processors which perform parallel data processing, video data containing enormous amounts of information can be decoded. In particular, in the case of displaying an image with a resolution higher than the full high definition, the decoder circuit for decoding compressed data preferably includes a processor having extremely high-speed processing capability. The decoder circuit preferably includes a plurality of processors capable of performing 4 or more, preferably 8 or more, further preferably 16 or more parallel operations. The decoder may include a circuit for separating a signal used for an image and contained in the input signal from other signals (e.g., text data, broadcast program data, and certification data).

The antenna 181 can receive airwaves such as a ground wave and a satellite wave. The antenna 181 can receive airwaves for analog broadcasting, digital broadcasting, image-and-sound broadcasting, sound-only broadcasting, or the like. For example, the antenna 181 can receive airwaves transmitted in a certain frequency band, such as a UHF band (about 300 MHz to 3 GHz) or a VHF band (30 MHz to 300 MHz). When a plurality of pieces of data received in a plurality of frequency bands are used, the transfer rate can be increased and more information can thus be obtained. Accordingly, the display device 110 can display an image with a resolution higher than the full high definition, such as 4K2K, 8K4K, 16K8K, or more.

Alternatively, the tuner may be configured to generate a signal using broadcasting data transmitted with data transmission technology through a computer network. The signal is transmitted to the display portion control device 164. In the case where the tuner receives a digital signal, the tuner does not necessarily include the demodulation circuit and the AD converter circuit.

The orientation determination portion 165 has a function of detecting a tilt, an orientation, and the like of the electronic device 100. For example, an acceleration sensor, an angular velocity sensor, a vibration sensor, a pressure sensor, a gyroscope sensor, or the like can be used for the orientation determination portion 165. Alternatively, these sensors may be combined to be used.

Examples of the external interface 168 include one or more buttons or switches provided on the housing 101 (also referred to as housing switches) and one or more external ports to which another input component can be connected.

The external interface 168 is connected to the arithmetic device 161 via the bus line 145. Examples of the housing switches include a switch associated with powering on/off, a button for adjusting volume, and a camera button.

The external port of the external interface 168 can be connected to an external device such as a computer or a printer through a cable. A USB terminal is a typical example. As the external port, a local area network (LAN) connection terminal, a digital broadcasting reception terminal, an AC adaptor connection terminal, or the like may be provided. A transceiver for optical communication, without limitation to wire communication, using infrared rays, visible light, ultraviolet rays, or the like may be provided.

The imaging device 175 is connected to the arithmetic device 161 via the bus line 145. The imaging device 175 can take a still image or a moving image in synchronization with pushing a switch provided on the housing or touching the touch sensor 176. The imaging device 175 may include a light source for taking images. For example, a lamp such as a xenon lamp, a light-emitting element such as an LED or an organic EL element, or the like can be used. Alternatively, the display device 110 and light emitted from the display device 110 may be used as the light source for taking images, in which case not only white light but also light of various colors may be used as the light source for taking images.

The vibration device 166 includes a vibrating element for vibrating the electronic device 100 and a vibration controller for controlling the vibrating element. As the vibrating element, an element capable of converting an electric signal or a magnetic signal into vibration, such as a vibration motor (eccentric motor), a resonant actuator, a magnetostrictive element, or a piezoelectric element can be used.

The vibration device 166 can vibrate the electronic device 100 in a variety of vibration patterns by controlling the number of vibrations, the amplitude, vibration time, and the like of the vibrating element according to instructions from the arithmetic device 161. The vibration device 166 can generate vibration in a variety of vibration patterns based on operation executed by a variety of applications. Examples of such vibration include vibration linked with operation of the housing switch or the like, vibration linked with startup of the electronic device 100, vibration linked with a moving image or a sound reproduced by an application for reproducing a moving image, vibration linked with reception of an e-mail, and vibration linked with input operation to the touch sensor 176.

The sensor module 167 includes a sensor unit and a sensor controller. The sensor controller supplies electric power from the battery 179 or the like to the sensor unit. Moreover, the sensor controller converts the input from the sensor unit into a control signal and outputs it to the arithmetic device 161 via the bus line 145. The sensor controller may handle errors made by the sensor unit or may calibrate the sensor unit. Note that the sensor controller may include a plurality of controllers which control the sensor unit.

The sensor module 167 may include any of a variety of sensors which have a function of measuring force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, or infrared rays.

This embodiment can be implemented in appropriate combination with any of the structures described in the other embodiments and the like.

Embodiment 2

In this embodiment, an electronic device 100C which is a modification example of the electronic device 100 will be described with reference to the drawings. Note that the structures of the electronic device 100A and the electronic device 100B can also be used for the electronic device 100C. In order to avoid repeated description, the description is mainly given on structures that are different from those of the electronic device 100. FIGS. 10A to 10C, FIGS. 11A and 11B, FIGS. 12A and 12B, and FIGS. 13A and 13B are perspective views each illustrating an appearance of the electronic device 100C.

Figure 10A:
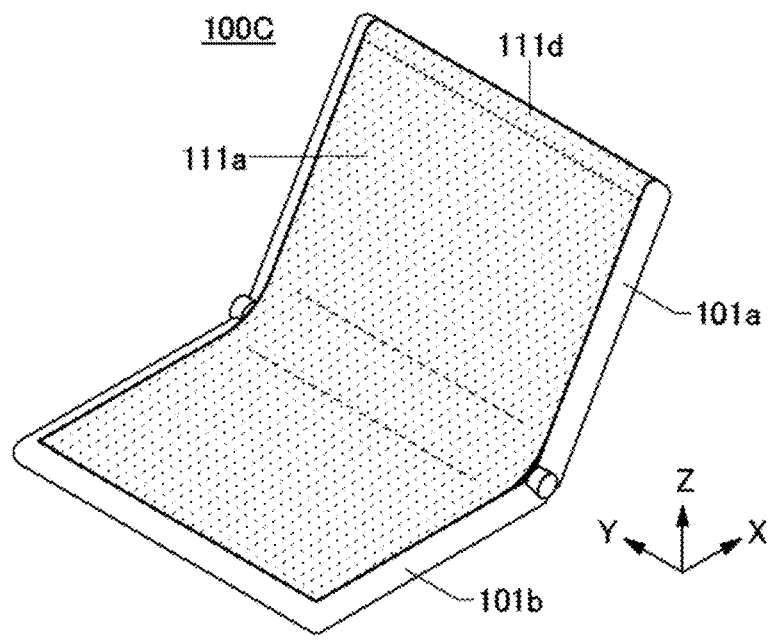
FIGS. 10A to 10C illustrate an electronic device.
Figure 10B:
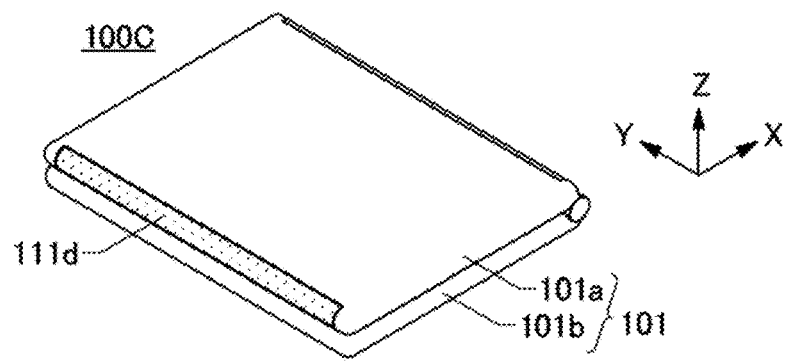
Figure 10C:
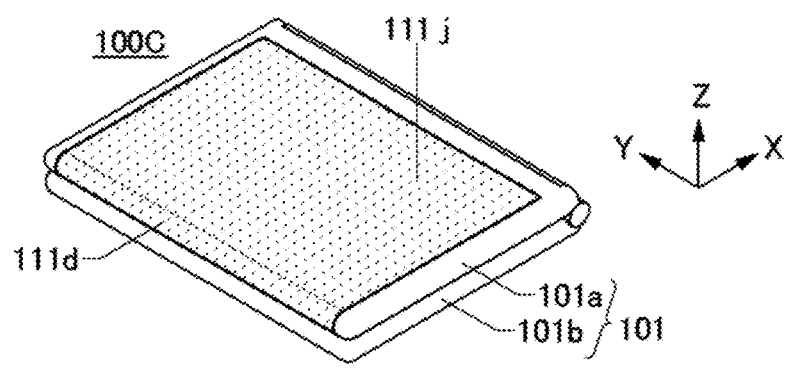

FIG. 10A illustrates the electronic device 100C which is vertically open with the housing 101a located on the upper side. FIGS. 10B and 10C each illustrate the electronic device 100C in the closed state.

As illustrated in FIGS. 10A and 10B, the display device 110 may include a display region 111d which overlaps with and is provided along a side surface on the top side of the housing 101a. Furthermore, as illustrated in FIG. 10C, the display device 110 may include a display region 111j which overlaps with a rear surface of the housing 101a.

Figure 11A:
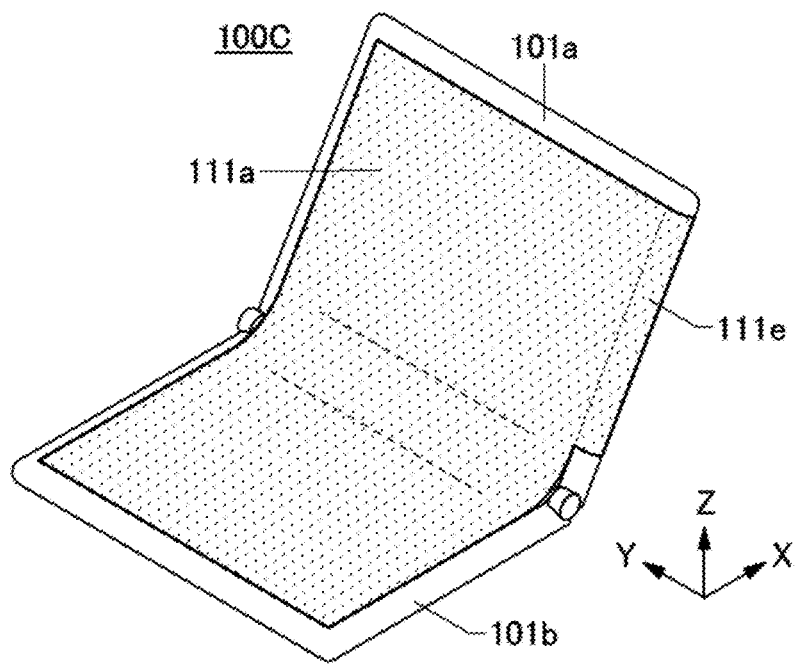
FIGS. 11A and 11B each illustrate an electronic device.
Figure 11B:
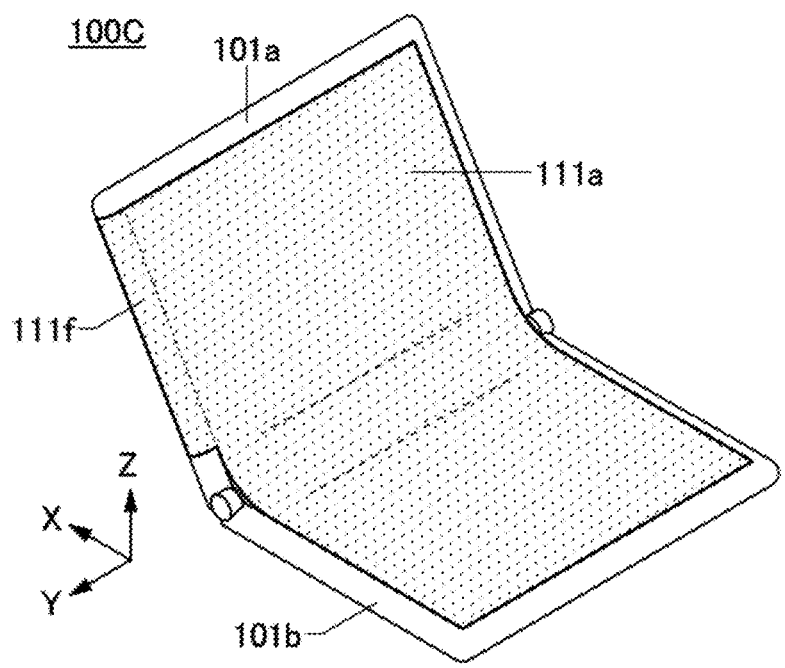

Moreover, as illustrated in FIG. 11A, the display device 110 may include a display region 111e which overlaps with and is provided along a side surface on the right side of the housing 101a. Furthermore, as illustrated in FIG. 11B, the display device 110 may include a display region 111f which overlaps with and is provided along a side surface on the left side of the housing 101a.

Figure 12A:
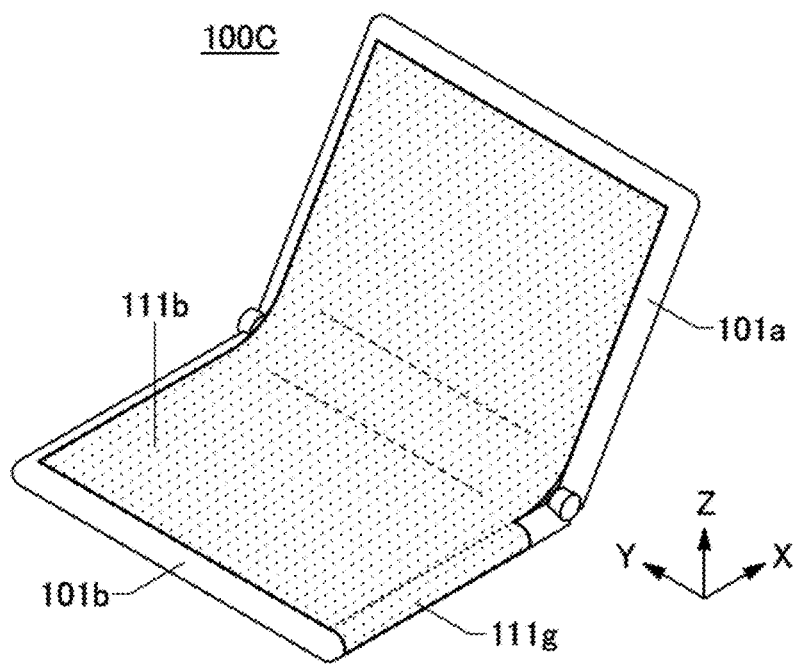
FIGS. 12A and 12B each illustrate an electronic device.
Figure 12B:
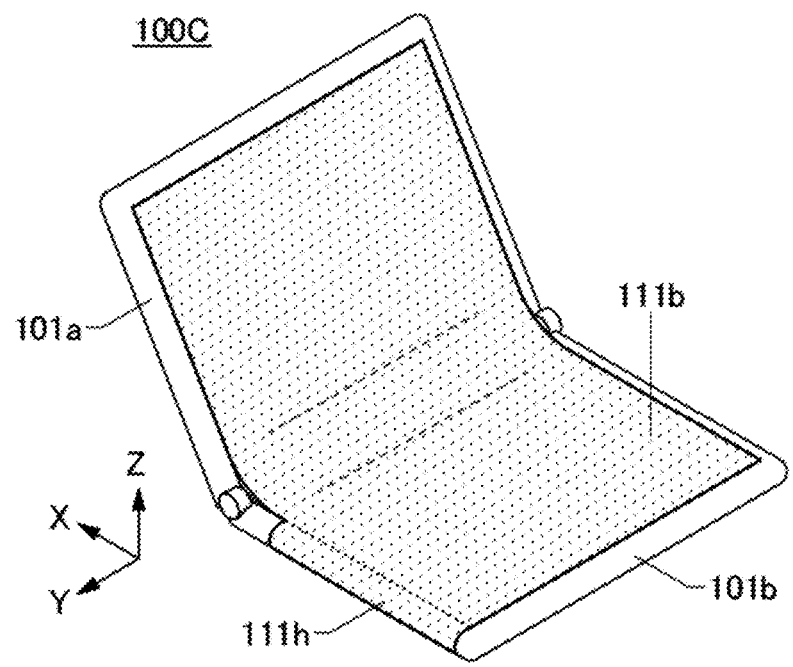

Moreover, as illustrated in FIG. 12A, the display device 110 may include a display region 111g which overlaps with and is provided along a side surface on the right side of the housing 101b. Furthermore, as illustrated in FIG. 12B, the display device 110 may include a display region 111h which overlaps with and is provided along a side surface on the left side of the housing 101b.

Figure 13A:
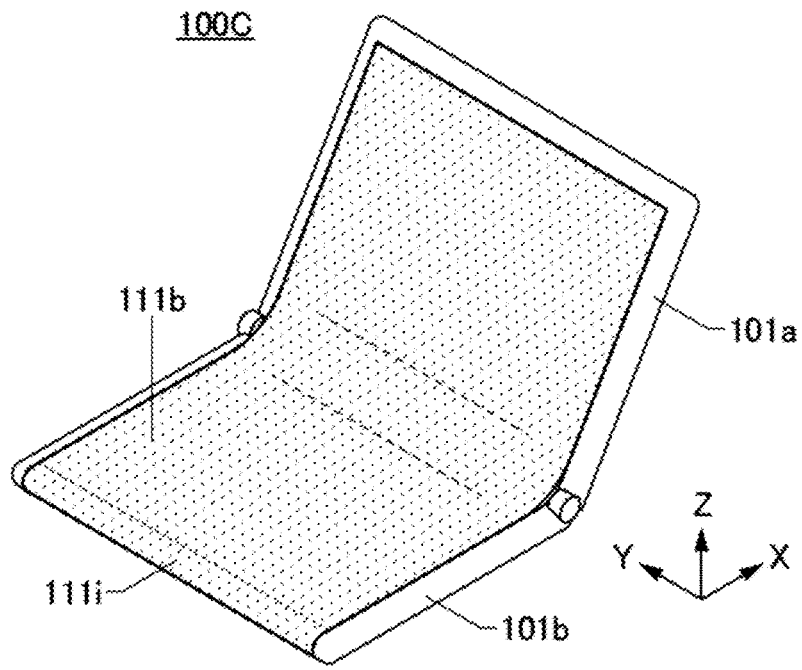
FIGS. 13A and 13B each illustrate an electronic device.

As illustrated in FIG. 13A, the display device 110 may include a display region 111i which overlaps with and is provided along a side surface on the bottom side of the housing 101b.

Figure 13B:
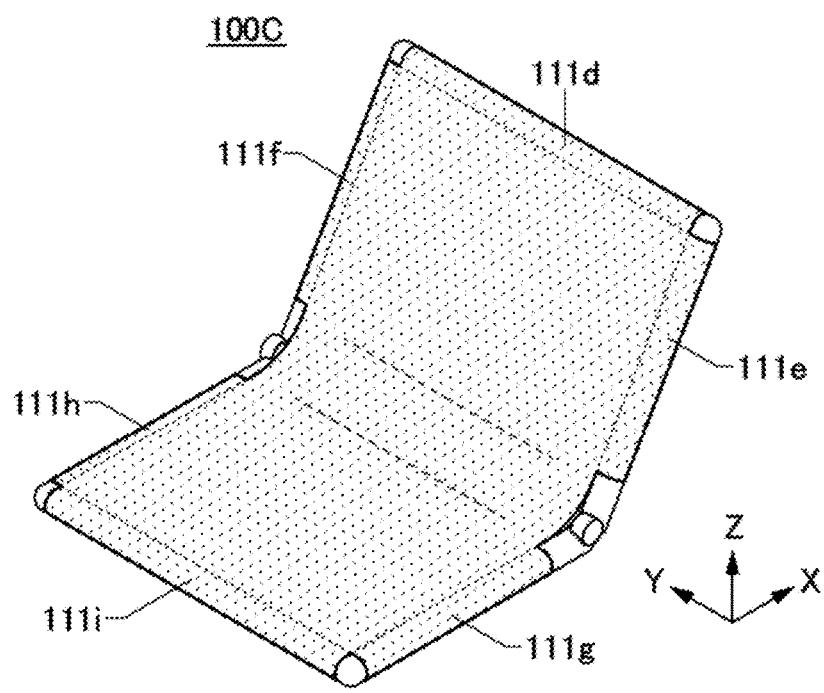

As illustrated in FIG. 13B, the display device 110 may include the display regions 111d, 111e, 111f, 111g, 111h, and 111i. When a display portion is provided in at least one of the side surfaces of the electronic device 100C, a user can obtain necessary information even in the closed state of the electronic device 100C.

The side surfaces of the housing 101 overlapping with the display regions 111d, 111e, 111f, 111g, 111h and/or 111i preferably include a curved surface.

In the display device 110, the display regions 111a, 111b, 111c and/or 111j may be regions where hybrid display is possible (hybrid display device), and the display regions 111d, 111e, 111f, 111g, 111h and/or 111i may be regions where display only by electroluminescence (EL) is possible (EL display device) or display only with liquid crystal is possible (liquid crystal display device).

The thickness of the display device 110 in the region where display only by electroluminescence (EL) is possible and the thickness of the region where display only with liquid crystal is possible can be smaller than that in the region where hybrid display is possible. For example, the EL display device can be easily thinned because a polarizing plate is not an absolute necessity for the EL display device. Furthermore, even the liquid crystal display device can be thinned when a liquid crystal element that operates in a guest-host mode is used to negate the need for a polarizing plate. A reduction in the thickness of the display device 110 leads to the bending easiness of the display device 110. Therefore, the display device 110 can be easily curved along the side surface.

This embodiment can be implemented in appropriate combination with any of the structures described in the other embodiments and the like.

Embodiment 3

In this embodiment, a structure example of the display device 110 is described.

The display device 110 can employ various modes and include various display elements. Examples of display elements include display elements containing a display medium whose contrast, luminance, reflectance, transmittance, or the like is changed by electrical or magnetic effect, such as an electroluminescent (EL) element (e.g., an EL element containing organic and inorganic materials, and an EL element containing an organic or inorganic material), an LED (e.g., a white LED, a red LED, a green LED, and a blue LED), a transistor (a transistor that emits light depending on current), an electron emitter, a liquid crystal element, electronic ink, an electrophoretic element, a grating light valve (GLV), a display element using microelectromechanical systems (MEMS), a digital micromirror device (DMD), a digital micro shutter (DMS), MIRASOL (registered trademark), an interferometric modulation (IMOD) element, a MEMS shutter display element, an optical-interference-type MEMS display element, an electrowetting element, a piezoelectric ceramic display, and a display element using a carbon nanotube. Moreover, quantum dots may be used for the display element.

Examples of display devices including EL elements include an EL display device. Examples of display devices including electron emitters are a field emission display device (FED) and a surface-conduction electron-emitter display (SED). Examples of display devices including quantum dots include a quantum dot display device.

Examples of display devices including liquid crystal elements include a liquid crystal display device (e.g., a transmissive liquid crystal display device, a transflective liquid crystal display device, a reflective liquid crystal display device, a direct-view liquid crystal display device, and a projection liquid crystal display device). Examples of display devices including electronic ink, electronic liquid powder (registered trademark), or electrophoretic elements include electronic paper. Other examples of display devices are a plasma display panel (PDP), a retina scanning type projector, and a display device including a micro LED.

In a transflective liquid crystal display device and a reflective liquid crystal display device, some or all of pixel electrodes function as reflective electrodes. For example, some or all of pixel electrodes are formed to contain aluminum, silver, or the like. In such a case, a memory circuit such as SRAM can be provided under the reflective electrodes. Thus, power consumption can be further reduced.

In the case of using an LED, graphene or graphite may be provided under an electrode or a nitride semiconductor of the LED. Graphene or graphite may be a multilayer film in which a plurality of layers are stacked. Providing graphene or graphite in the above manner facilitates formation of a nitride semiconductor thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when graphene is provided, the GaN semiconductor layers included in the LED can also be formed by a sputtering method.

As the display device 110, a display device including both a reflective display element and a light-emission-type display element (also referred to as a light-emitting element) and can perform display in both a reflective mode and a light-emitting mode can be used.

Structure examples of the display device 110 will be described. FIG. 14A is a block diagram illustrating a structure example of the display device 110. The display device 110 includes a display region 231, a circuit 232, and a circuit 233.

The display region 231 includes the plurality of pixels 230 arranged in a matrix, a plurality of wirings G1, a plurality of wirings G2, a plurality of wirings ANO, a plurality of wirings CSCOM, a plurality of wirings S1, and a plurality of wirings S2. The wirings G1, the wirings G2, the wirings ANO, and the wirings CSCOM are electrically connected to the plurality of pixels 230 arranged in a direction R and to the circuit 232. The wirings S1 and the wirings S2 are electrically connected to the plurality of pixels 230 arranged in a direction C and to the circuit 233.

Although FIG. 14A illustrates a structure including one circuit 232 and one circuit 233, the circuit 232 and the circuit 233 for driving a liquid crystal element and those for driving an EL element (a light-emitting element using an EL material) may be provided separately.

Part of the circuits 232 and 233 or the entire circuits 232 and 233 may be formed over another substrate and electrically connected to the display device 110. For example, part of the circuits 232 and 233 or the entire circuits 232 and 233 may be formed over a single crystal substrate and electrically connected to the display device 110.

The pixels 230 each include a reflective liquid crystal element functioning as a reflective display element and an EL element functioning as a light-emission-type display element. In each of the pixels 230, the liquid crystal element and the EL element partly overlap each other.

Full-color display can be achieved by making a pixel 230 that emits or reflects red light, a pixel 230 that emits or reflects green light, and a pixel 230 that emits or reflects blue light collectively function as one pixel and by controlling the amount of light emitted from each pixel (or the luminance of reflected light). Thus, these three pixels each function as a sub-pixel. In other words, three sub-pixels control, for example, the transmittance, the reflectance, or the amount of emitted light of red light, green light, and blue light. The colors of light controlled by the three sub-pixels are not limited to the combination of red, green, and blue and may be cyan, magenta, and yellow.

Four sub-pixels may collectively function as one pixel. For example, a sub-pixel that controls white light may be added to the three sub-pixels that control red light, green light, and blue light. The addition of the sub-pixel that controls white light can increase the luminance of the display region. When sub-pixels that control red, green, blue, cyan, magenta, yellow, and the like are combined as appropriate with more sub-pixels functioning as one pixel, the range of color reproduction can be increased.

Using the plurality of pixels arranged in a 1920×1080 matrix, the display device 110 can display an image with "full high definition" (also referred to as "2K resolution," "2K1K," "2K," and the like). Using the pixels arranged in a 3840×2160 matrix, the display device 110 can display an image with "ultra high definition" (also referred to as "4K resolution," "4K2K," "4K," and the like). Using the pixels arranged in a 7680×4320 matrix, the display device 110 can display an image with "super high definition" (also referred to as "8K resolution," "8K4K," "8K," and the like). Using a larger number of pixels, the display device 110 can display an image with 16K or 32K resolution.

FIG. 14B1 illustrates a structure example of an electrode 245 included in the pixel 230. The electrode 245 serves as a reflective electrode of the liquid crystal element in the pixel 230. The electrode 245 includes an opening 451.

In FIG. 14B1, a light-emitting element 370 in a region overlapping with the electrode 245 is denoted by a dashed line. The light-emitting element 370 overlaps with the opening 451 included in the electrode 245. Thus, light from the light-emitting element 370 is emitted to a display surface side through the opening 451.

In FIG. 14B1, the pixels 230 adjacent in the direction R correspond to different emission colors. As illustrated in FIG. 14B1, the openings 451 are preferably provided in different positions in the electrodes 245 so as not to be aligned in the two pixels adjacent to each other in the direction R. This allows the two light-emitting elements 370 to be apart from each other, thereby preventing light emitted from the light-emitting element 370 from entering a coloring layer in the adjacent pixel 230 (such a phenomenon is also referred to as "crosstalk"). Furthermore, since the two adjacent light-emitting elements 370 can be arranged apart from each other, a high-resolution display device is achieved even when EL layers of the light-emitting elements 370 are separately formed with a shadow mask or the like.

Alternatively, the arrangement illustrated in FIG. 14B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 370 is dark.

If the area of the opening 451 in the electrode 245 serving as a reflective electrode is too small, light emitted from the light-emitting element 370 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel emitting light of the same color, in which case crosstalk can be suppressed.

As illustrated in FIGS. 14B3 and 14B4, a light-emitting region of the light-emitting element 370 may be positioned in a region where the electrode 245 is not provided, in which case light emitted from the light-emitting element 370 is emitted to the display surface side.

In FIG. 14B3, the light-emitting elements 370 are not aligned in two adjacent pixels 230 provided in the direction indicated by the arrow R. In FIG. 14B4, the light-emitting elements 370 are aligned in two adjacent pixels 230 provided in the direction indicated by the arrow R.

The structure illustrated in FIG. 14B3 can, as mentioned above, prevent crosstalk and increase the resolution because the light-emitting elements 370 included in two adjacent pixels 230 can be apart from each other. The structure illustrated in FIG. 14B4 can prevent light emitted from the light-emitting element 370 from being blocked by the electrode 245 because the electrode 245 is not positioned along a side of the light-emitting element 370 which is parallel to the direction indicated by the arrow C. Thus, high viewing angle characteristics can be achieved.

As the circuit 232, any of a variety of sequential circuits such as a shift register can be used. In the circuit 232, a transistor, a capacitor, and the like can be used. A transistor included in the circuit 232 can be formed in the same steps as the transistors included in the pixels 230.

The circuit 233 is electrically connected to the wirings S1. For example, an integrated circuit can be used as the circuit 233. Specifically, an integrated circuit formed on a silicon substrate can be used as the circuit 233.

For example, a chip on glass (COG) method, a chip on film (COF) method, or the like can be used to mount the circuit 233 on a pad electrically connected to the pixels 230. Specifically, an anisotropic conductive film can be used to mount an integrated circuit on the pad.

Circuit Structure Example of Pixel 230

Figure 15:
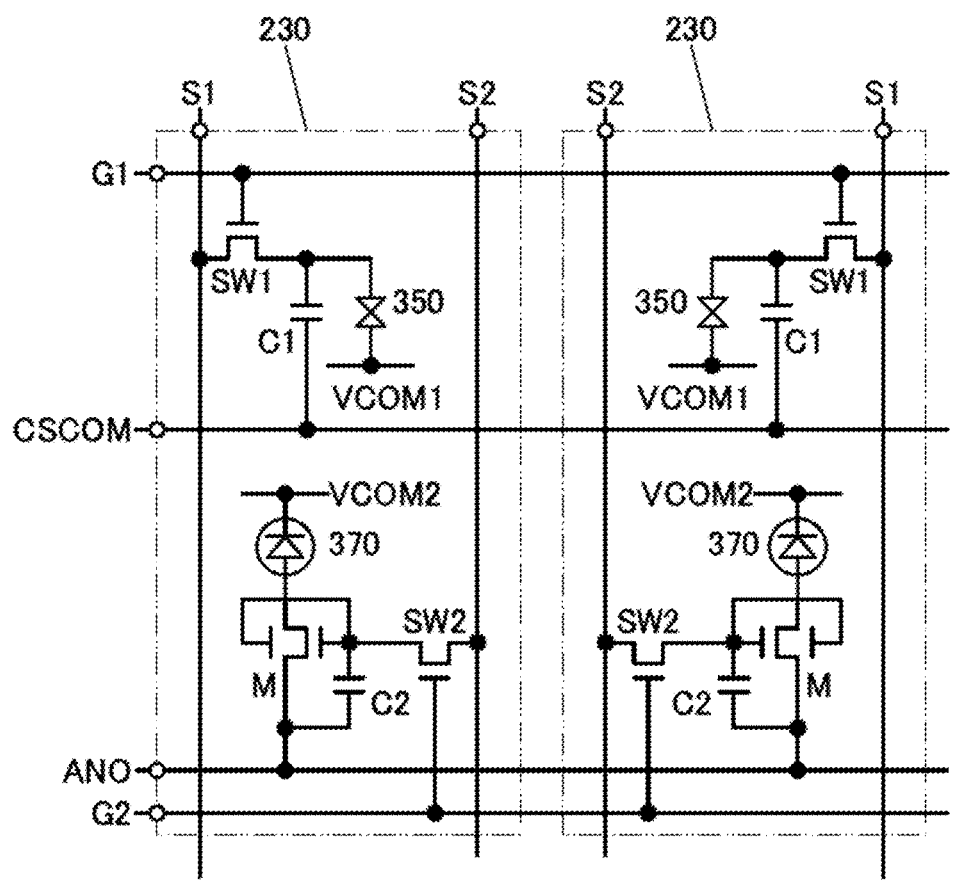
FIG. 15 illustrates a circuit structure example of pixels.

FIG. 15 shows a circuit structure example of the pixels 230. FIG. 15 shows two adjacent pixels 230.

The pixels 230 each include a switch SW1, a capacitor C1, a liquid crystal element 350, a switch SW2, a transistor M, a capacitor C2, the light-emitting element 370, and the like. The pixel 230 is electrically connected to the wiring G1, the wiring G2, the wiring ANO, the wiring CSCOM, the wiring S1, and the wiring S2. FIG. 15 illustrates a wiring VCOM1 electrically connected to the liquid crystal element 350 and a wiring VCOM2 electrically connected to the light-emitting element 370.

FIG. 15 illustrates an example in which a transistor is used as each of the switches SW1 and SW2.

A gate of the switch SW1 is connected to the wiring G1. One of a source and a drain of the switch SW1 is connected to the wiring S1, and the other is connected to one electrode of the capacitor C1 and one electrode of the liquid crystal element 350. The other electrode of the capacitor C1 is connected to the wiring CSCOM. The other electrode of the liquid crystal element 350 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 370. Furthermore, the other electrode of the light-emitting element 370 is connected to the wiring VCOM2.

FIG. 15 illustrates an example where the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 350. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 370 emit light. The wiring S2 can be supplied with a signal for changing the conduction state of the transistor M.

In the pixel 230 of FIG. 15, for example, an image can be displayed in the reflective mode by driving the pixel with the signals supplied to the wiring G1 and the wiring S1 and utilizing the optical modulation of the liquid crystal element 350. In the case where an image is displayed in the light-emitting mode, the pixel is driven with the signals supplied to the wiring G2 and the wiring S2 and the light-emitting element 370 emits light. In the case where both modes are performed at the same time, the pixel can be driven with the signals supplied to the wiring G1, the wiring G2, the wiring S1, and the wiring S2.

Figure 16A:
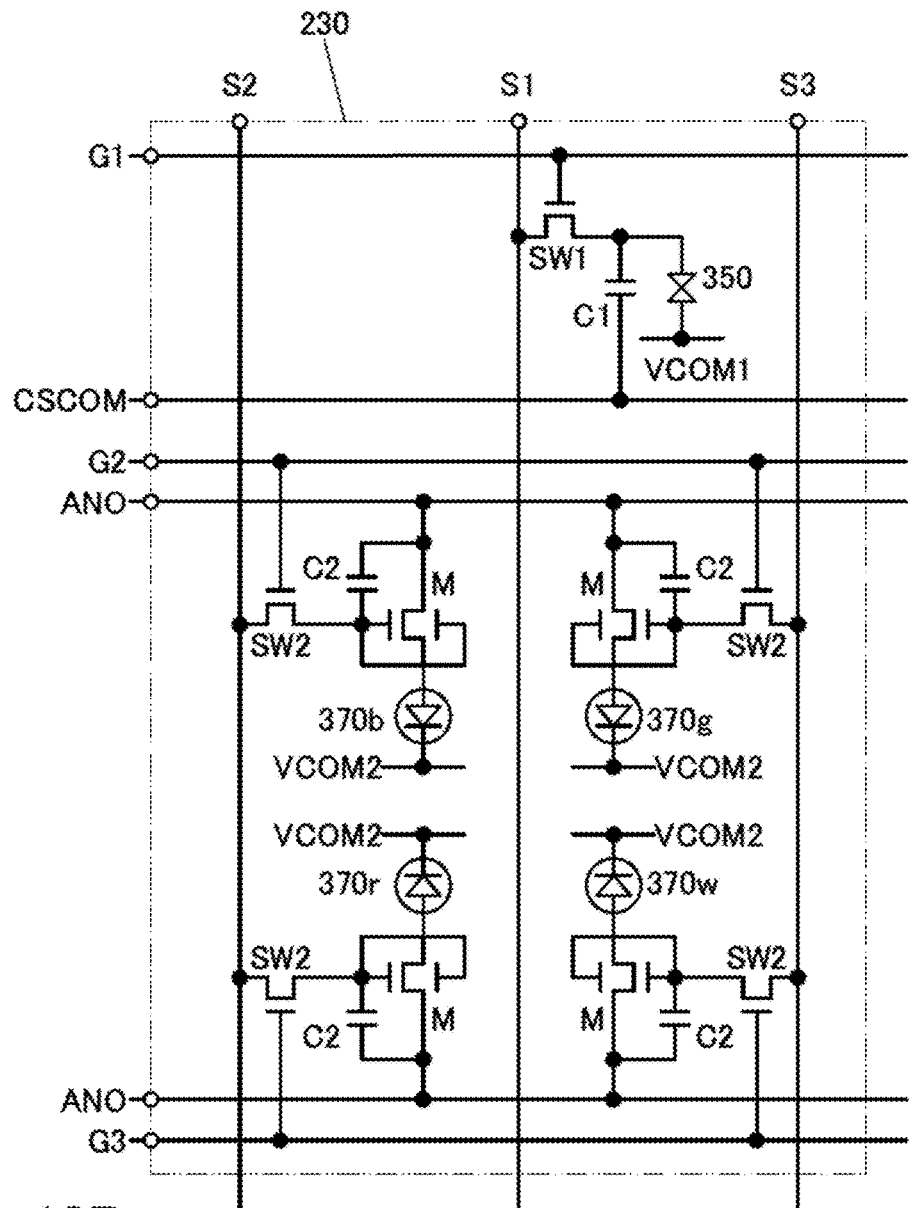
FIGS. 16A and 16B illustrate a circuit structure example of a pixel and a plan-view structure example.

Although FIG. 15 illustrates an example in which one liquid crystal element 350 and one light-emitting element 370 are provided in one pixel 230, one embodiment of the present invention is not limited thereto. FIG. 16A illustrates an example in which one liquid crystal element 350 and four light-emitting elements 370 (light-emitting elements 370r, 370g, 370b, and 370w) are provided in one pixel 230. The pixel 230 illustrated in FIG. 16A differs from that in FIG. 15 in being capable of performing full-color display by one pixel.

In FIG. 16A, in addition to the wirings in FIG. 15, a wiring G3 and a wiring S3 are connected to the pixel 230.

In the example in FIG. 16A, light-emitting elements emitting red light (R), green light (G), blue light (B), and white light (W) can be used as the four light-emitting elements 370, for example. Furthermore, as the liquid crystal element 350, a reflective liquid crystal element emitting white light can be used. Thus, in the case of performing display in the reflective mode, white display with high reflectivity can be performed. In the case of performing display in the light-transmitting mode, images can be displayed with a higher color rendering property at low power consumption.

Figure 16B:
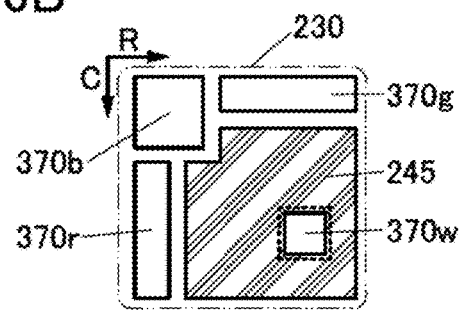

FIG. 16B illustrates a structure example of the pixel 230. The pixel 230 includes the light-emitting element 370w overlapping with the opening included in the electrode 245 and the light-emitting element 370r, the light-emitting element 370g, and the light-emitting element 370b which are arranged in the periphery of the electrode 245. It is preferable that the light-emitting elements 370r, 370g, and 370b have almost the same light-emitting area.

<Display Mode>

The display device 110 can be operated in three display modes. A first display mode (mode 1) is a display mode for displaying an image as a reflective liquid crystal display device. A second display mode (mode 2) is a display mode for displaying an image as a light-emitting display device. A third display mode (mode 3) is a display mode in which the first display mode and the second display mode are adopted at the same time.

[First Display Mode]

In the first display mode, a light source is not necessary and thus the first display mode is a display mode with extremely low power consumption. For example, the first display mode is particularly effective in the case where external light is white or near-white light with sufficiently high illuminance. Furthermore, the first display mode is particularly effective in an environment with an illuminance of more than approximately 300 lx, for example, in the light of daytime. However, depending on the purpose, uses, or the like, the display device 110 can be made to operate in the first display mode even in an environment with an illuminance of less than approximately 300 lx, in some cases.

The first display mode is a display mode suitable for displaying text information of a book or a document, for example. The first display mode can offer eye-friendly display because reflected light is used for displaying an image, and thus has an effect of being unlikely to cause eyestrain.

FIG. 17A1 illustrates a state in which an electronic device 910 is used outdoors in the daytime. In FIG. 17A1, a display device of the electronic device 910 operates in the first display mode. The electronic device 910 is a portable information terminal such as a smartphone, for example. The electronic device 910 includes the display device 110 of one embodiment of the present invention.

FIG. 17A2 illustrates incident light 901 which enters the display device 110 of the electronic device 910 and reflected light 902 which is reflected by the display device 110.

[Second Display Mode]

The second display mode is a display mode that allows extremely vivid (high contrast and high color reproducibility) display regardless of the illuminance of external light and the chromaticity. For example, the second display mode is effective in the case where the illuminance of external light is low, such as during the nighttime or in a room. The second display mode is particularly effective in an environment with an illuminance of less than approximately 5000 lx. However, depending on the purpose, uses, or the like, the display device 110 can be made to operate in the second display mode even in an environment with an illuminance of more than approximately 5000 lx, in some cases. When a bright image is displayed at a low external light illuminance, a user may feel that the image is too bright. To prevent this, an image with reduced luminance is preferably displayed in the second display mode. Thus, not only a reduction in the luminance but also low power consumption can be achieved. The second display mode is a mode suitable for displaying a vivid image and a smooth moving image, for example.

FIG. 17B1 illustrates a state in which the electronic device 910 is used outdoors in the nighttime. An electronic device 920 in FIG. 17B1 is an electronic device used in digital signage. In FIG. 17B1, the display devices in the electronic device 910 and the electronic device 920 operate in the second display mode. The electronic device 920 includes the display device 110 of one embodiment of the present invention.

FIG. 17B2 illustrates emitted light 903 which is emitted from the display device 110 of the electronic device 910 and emitted light 903 which is emitted from the display device 110 of the electronic device 920.

[Third Display Mode]

The third display mode is a display mode for displaying an image by utilizing both reflected light in the first display mode and emitted light in the second display mode. For example, in the case where light having a luminance that is more than or equal to a maximum luminance of the reflected light in the first display mode needs to be emitted from the display device 110, light emission in the second display mode can make up for a shortage of light. Furthermore, for example, reflected light in the first display mode and emitted light in the second display mode can be combined to express one color.

The third display mode can display a more vivid image than the first display mode and suppress power consumption compared with the second display mode. For example, the third display mode is effective when the illuminance of external light is relatively low such as under indoor illumination or in the morning or evening, or when the external light does not represent a white chromaticity.

The third display mode is particularly effective in an environment with an illuminance of less than approximately 5000 lx. However, depending on the purpose, uses, or the like, the display device 110 can be made to operate in the third display mode even in an environment with an illuminance of more than approximately 5000 lx, in some cases.

FIG. 17C1 illustrates a state in which the electronic device 910 is used indoors. An electronic device 930 in FIG. 17C1 is an electronic device that can function as a television or a monitor. Furthermore, an electronic device 940 in FIG. 17C1 is a laptop personal computer. In FIG. 17C1, the display devices in the electronic devices 910, 930, and 940 operate in the third display mode. The electronic device 930 and the electronic device 940 each include the display device 110 of one embodiment of the present invention.

FIG. 17C2 illustrates the emitted light 903 which is emitted from the display device 110 of the electronic device 910, the incident light 901 which enters the display device 110 of the electronic device 910, and the reflected light 902 which is reflected by the display device 110 of the electronic device 910. In addition, FIG. 17C2 illustrates the emitted light 903 which is emitted from the display device 110 of the electronic device 930, the incident light 901 which enters the display device 110 of the electronic device 930, and the reflected light 902 which is reflected by the display device 110 of the electronic device 930. The display device 110 of the electronic device 940 can function in a manner similar to that of the other display devices 110.

Note that display using the third display mode can also be referred to as "hybrid display mode." Hybrid display is a method for displaying a letter or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a display device that performs hybrid display (also referred to as "a hybrid display device" or "a hybrid display") is locally observed, a pixel or a subpixel performing display using any one of the plurality of display elements and a pixel or a subpixel performing display using two or more of the plurality of display elements are included in some cases.

Note that in the present specification and the like, hybrid display satisfies any one or a plurality of the above-described descriptions.

Furthermore, a hybrid display includes a plurality of display elements in one pixel or one subpixel. Note that as an example of the plurality of display elements, a reflective element that reflects light and a self-luminous element that emits light can be given. Note that the reflective element and the self-luminous element can be controlled independently. A hybrid display has a function of displaying a letter and/or an image using one or both of reflected light and self-emitted light in a display portion.

Specific Example of First to Third Display Modes

Here, a specific example of the case where the above-described first to third display modes are employed is described with reference to FIGS. 18A to 18D and FIGS. 20A to 20C.

Note that the case where the first to third display modes are switched automatically in accordance with the illuminance is described below. In the case where the mode is switched automatically in accordance with the illuminance, an illuminance sensor or the like is provided in the display device and the display mode can be switched in response to data from the illuminance sensor, for example.

Figure 18A:
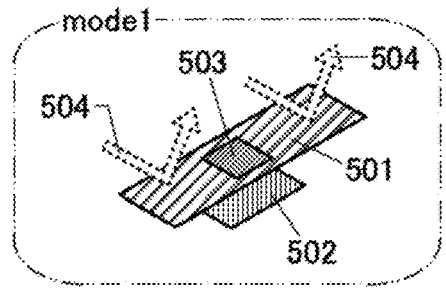
FIGS. 18A to 18D are schematic diagrams and a state transition diagram, illustrating a structure example of a display device.
Figure 18B:
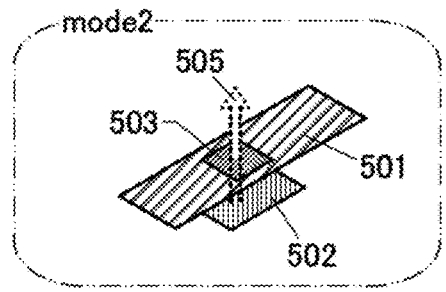
Figure 18C:
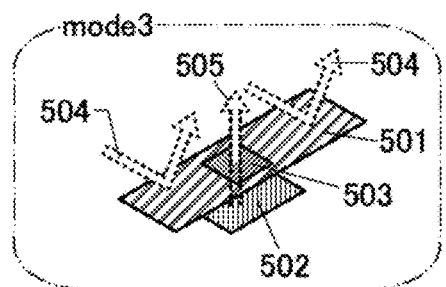

FIGS. 18A to 18C are schematic diagrams of a pixel for describing display modes that the display device of this embodiment can enter.

In FIGS. 18A to 18C, a first display element 501, a second display element 502, an opening 503, reflected light 504 that is reflected by the first display element 501, and transmitted light 505 emitted from the second display element 502 through the opening 503 are illustrated. Note that FIG. 18A, FIG. 18B, and FIG. 18C are diagrams illustrating a first display mode, a second display mode, and a third display mode, respectively.

FIGS. 18A to 18C illustrate the case where a reflective liquid crystal element is used as the first display element 501 and a light-emitting element is used as the second display element 502.

In the first display mode illustrated in FIG. 18A, gray scale display can be performed by driving the reflective liquid crystal element that is the first display element 501 to adjust the intensity of reflected light.

In the second display mode illustrated in FIG. 18B, gray scale display can be performed by adjusting the intensity of light emitted from the light-emitting element that is the second display element 502. Note that light emitted from the second display element 502 passes through the opening 503 and is extracted to the outside as the transmitted light 505.

The third display mode illustrated in FIG. 18C is a display mode in which the first display mode and the second display mode which are described above are combined. For example, gray scale is expressed in such a manner that the intensity of the reflected light 504 reflected by the reflective electrode in the reflective liquid crystal element that is the first display element 501 is adjusted with the liquid crystal layer. In a period during which the first display element 501 is driven, gray scale is expressed by adjusting the intensity of light emitted from the light-emitting element that is the second display element 502, i.e., the intensity of the transmitted light 505.

<State Transition of First to Third Display Modes>

Figure 18D:
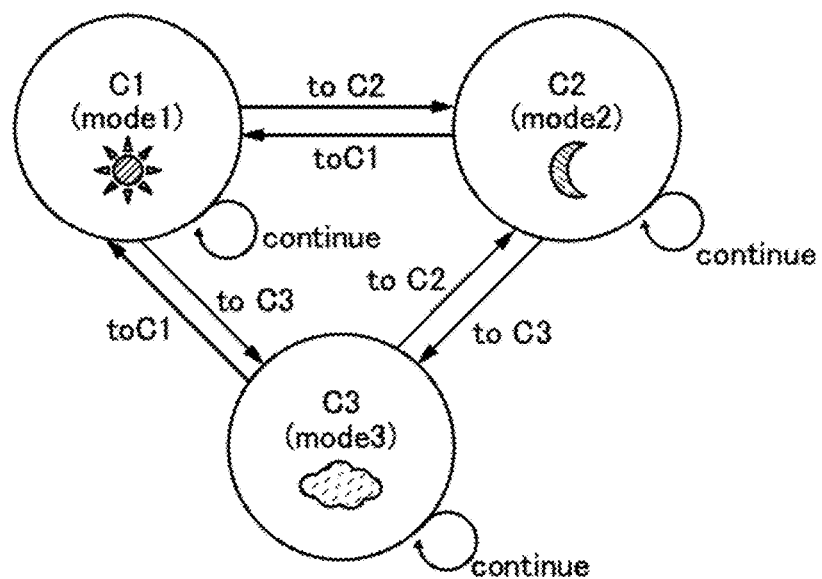

Next, a state transition of the first to third display modes is described with reference to FIG. 18D. FIG. 18D is a state transition diagram of the first display mode, the second display mode, and the third display mode. In FIG. 18D, a state C1, a state C2, and a state C3 correspond to the first display mode, the second display mode, and the third display mode, respectively.

As shown in FIG. 18D, any of the display modes can be selected in accordance with the illuminance in the states C1 to C3. For example, under a high illuminance such as in outdoor environments, the state C1 is selected. In the case where the illuminance decreases (e.g., when moving from outdoors to indoors), a change from the state C1 to the state C2 occurs. In the case where the illuminance is low even outdoors and gray scale display with reflected light is not sufficient, a transition from the state C1 to the state C3 occurs. Needless to say, a transition from the state C3 to the state C1, a transition from the state C2 to the state C3, a transition from the state C3 to the state C2, or a transition from the state C2 to the state C1 also occurs.

In FIG. 18D, symbols of the sun, the moon, and a cloud are illustrated as images representing the first display mode, the second display mode, and the third display mode, respectively.

As illustrated in FIG. 18D, in the case where the illuminance does not change or slightly changes in the states C1 to C3, the present state may be maintained without changing to another state.

The above configuration of switching the display mode in accordance with the illuminance contributes to a reduction in the frequency of gray scale display with a transmissive liquid crystal element, which requires a light source such as a backlight having relatively high power consumption. Accordingly, the power consumption of the display device can be reduced. In the display device, the operation mode can be further switched in accordance with the amount of remaining battery power, the contents to be displayed, the illuminance of the surrounding environment. Although the case where the display mode is automatically switched in accordance with the illuminance is described above as an example, one embodiment of the present invention is not limited thereto, and a user may switch the display mode manually.

<Evaluation of Hybrid Display>

Next, the luminance of the above-described hybrid display and a commercially available OLED display in external light was evaluated. In this evaluation, the display mode of the hybrid display was appropriately changed among the first to third display modes in accordance with the illuminance of external light as illustrated in FIG. 18D.

Figure 19A:
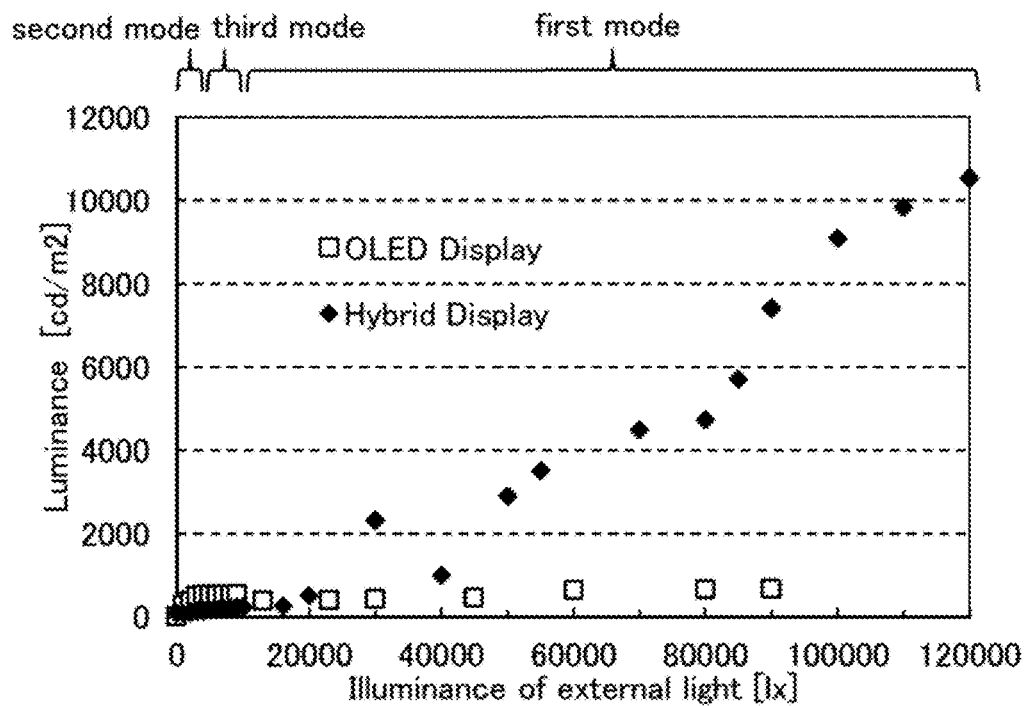
FIGS. 19A and 19B are graphs showing evaluation results of display devices.

FIG. 19A shows the evaluated luminance. In FIG. 19A, the horizontal axis represents the illuminance of external light [lx], and the vertical axis represents the luminance [cd/m$^2$] of the displays. Here, approximate standard illuminances of external light is 0.1 lx in the moonlight, 1000 lx in a room, 10000 lx in the shade in fine weather, and 100000 lx in sunlight in midsummer.

As shown in FIG. 19A, the luminance of the commercially available OLED display is approximately 500 cd/m$^2$; therefore, an enough luminance cannot be obtained outdoors (e.g., at an illuminance of 10000 lx or more), so that visibility is low. In contrast, the hybrid display is brought outdoors into the first display mode using the reflective liquid crystal element, so that a luminance proportional to the intensity of external light can be obtained. Thus, since an enough luminance can be obtained from the hybrid display outdoors, the hybrid display has higher outdoor visibility than the commercially available OLED display.

Next, power consumed in external light in the above-described hybrid display and the commercially available OLED display was evaluated. In this evaluation, as the commercially available OLED display, one having an automatic dimming function was used. The power necessary to obtain the same luminance as that of the OLED display was estimated by calculation.

Figure 19B:
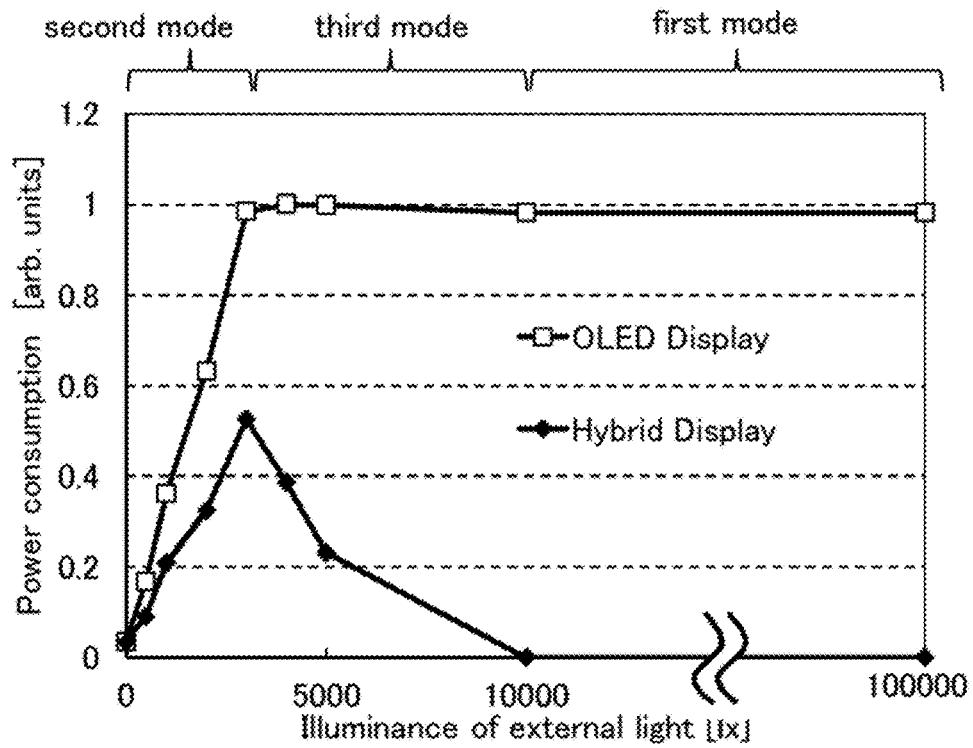

FIG. 19B shows the evaluated power consumption. In FIG. 19B, the horizontal axis represents the illuminance of external light [lx], and the vertical axis represents the power consumption [arb. units] of the displays. Here, the maximum value of the power consumption of the OLED display on the vertical axis is 1.

As shown in FIG. 19B, when the hybrid display is changed into the first display mode or the third display mode, the reflective liquid crystal element is used more, so that the luminance of the light-emitting element becomes lower; accordingly, the power consumption of the hybrid display can be reduced. The reduction in the power consumption of the light-emitting element in the hybrid display can reduce the power consumption of the hybrid display as a whole.

Moreover, when the hybrid display is changed into the first display mode outdoors, an enough luminance can be obtained only with the reflective liquid crystal element, so that the light-emitting element does not need to be used. At this time, power is not consumed by the light-emitting element in the hybrid display, so that the power consumption of the whole hybrid display can be significantly reduced.

<Operation Mode>

Next, an operation mode which can be employed in the first display element is described with reference to FIGS. 20A to 20C.

A normal driving mode (Normal mode) with a normal frame frequency (typically, higher than or equal to 60 Hz and lower than or equal to 240 Hz) and an idling stop (IDS) driving mode with a low frame frequency will be described below.

Note that the IDS driving mode refers to a driving method in which after image data is written, rewriting of image data is stopped. This increases the interval between writing of image data and subsequent writing of image data, thereby reducing the power that would be consumed by writing of image data in that interval. The IDS driving mode can be performed at a frame frequency which is 1/100 to 1/10 of the normal driving mode, for example. A still image is displayed by the same video signals in consecutive frames. Thus, the IDS driving mode is particularly effective when displaying a still image. When an image is displayed using IDS driving, power consumption is reduced, image flickering is suppressed, and eyestrain can be reduced.

Figure 20A:
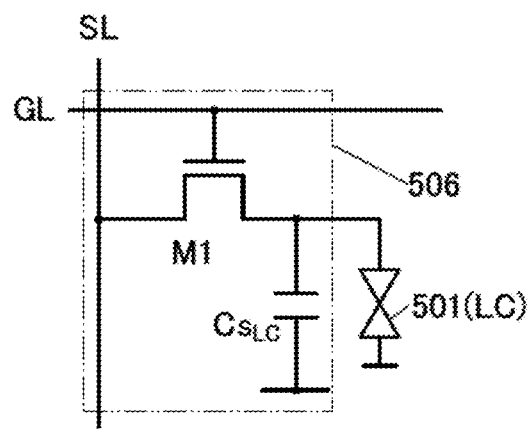
FIGS. 20A to 20C are a circuit diagram and timing charts illustrating a structure example of a display device.
Figure 20B:
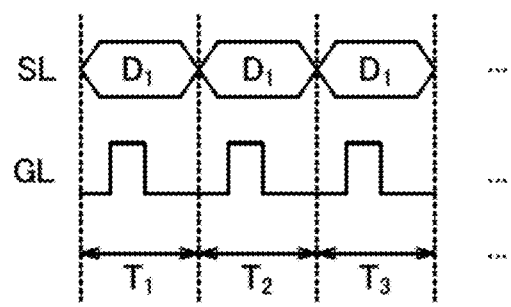
Figure 20C:
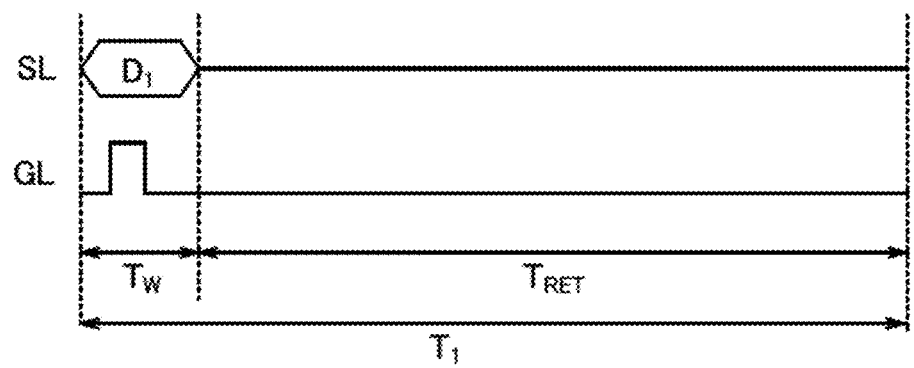

FIGS. 20A to 20C are a circuit diagram and timing charts illustrating the normal driving mode and the IDS driving mode. Note that in FIG. 20A, the first display element 501 (here, a reflective liquid crystal element) and a pixel circuit 506 electrically connected to the first display element 501 are illustrated. In the pixel circuit 506 illustrated in FIG. 20A, a signal line SL, a gate line GL, a transistor M1 connected to the signal line SL and the gate line GL, and a capacitor $C_{SLC}$ connected to the transistor M1 are illustrated.

A transistor including a metal oxide in a semiconductor layer in which a channel is formed is preferably used as the transistor M1. A metal oxide having at least one of an amplification function, a rectification function, and a switching function can be referred to as a metal oxide semiconductor or an oxide semiconductor (abbreviated to an OS). As a typical example of a transistor, a transistor including an oxide semiconductor in a semiconductor layer in which a channel is formed (OS transistor) is described. The OS transistor has an extremely low leakage current in a non-conduction state (off-state current), so that charge can be retained in a pixel electrode of a liquid crystal element when the OS transistor is turned off.

In the circuit diagram illustrated in FIG. 20A, a liquid crystal element LC is a leakage path of data $D_1$. Therefore, to perform IDS driving appropriately, the resistivity of the liquid crystal element LC is preferably higher than or equal to $1.0 \times 10^{14}$ Ω·cm.

Note that for example, an In—Ga—Zn oxide, an In—Zn oxide, or the like can preferably be used for a channel formation region of the above OS transistor. The In—Ga—Zn oxide can typically have an atomic ratio of In:Ga:Zn=4:2:4.1 or a neighborhood thereof.

FIG. 20B is a timing chart showing waveforms of signals supplied to the signal line SL and the gate line GL in the normal driving mode. In the normal driving mode, a normal frame frequency (e.g., 60 Hz) is used for operation. Periods $T_1$, a period $T_2$, and a period $T_3$ are shown in FIG. 20B. A scanning signal is supplied to the gate line GL in each frame period and data $D_1$ is written from the signal line SL. This operation is performed both to write the same data $D_1$ in the periods $T_1$ to $T_3$ and to write different data in the periods $T_1$ to $T_3$.

FIG. 20C is a timing chart showing waveforms of signals supplied to the signal line SL and the gate line GL in the IDS driving mode. In the IDS driving, a low frame frequency (e.g., 1 Hz) is used for operation. One frame period is denoted by a period $T_1$ and includes a data writing period $T_W$ and a data retention period $T_{RET}$. In the IDS driving mode, a scanning signal is supplied to the gate line GL and the data $D_1$ of the signal line SL is written in the period $T_W$, the gate line GL is fixed to a low-level voltage in the period $T_{RET}$, and the transistor M1 is turned off so that the written data $D_1$ is retained. Note that the low frame frequency may be higher than or equal to 0.1 Hz and lower than 60 Hz, for example.

The IDS driving mode is effective in combination with the aforementioned first display mode or third display mode, in which case power consumption can be further reduced.

As described above, the display device of this embodiment can display an image by switching between the first to third display modes. Thus, an all-weather display device or a highly convenient display device with high visibility regardless of the ambient brightness can be fabricated.

The display device described in this embodiment preferably includes a plurality of first pixels including first display elements and a plurality of second pixels including second display elements. The first pixels and the second pixels are preferably arranged in matrices.

Each of the first pixels and the second pixels can include one or more sub-pixels. In the display device described in this embodiment, the first pixels can display a full-color image and the second pixels can display a full-color image. Alternatively, the display device described in this embodiment can be configured to display a black-and-white image or a grayscale image using the first pixels and can display a full-color image using the second pixels. The first pixels that can be used for displaying a black-and-white image or a grayscale image are suitable for displaying information that need not be displayed in color such as text information.

The display device of one embodiment of the present invention can reproduce the color gamut of various standards. For example, the display device of one embodiment of the present invention can reproduce the color gamut of the following standards: the Phase Alternating Line (PAL) or National Television System Committee (NTSC) standard used for TV broadcasting; the standard RGB (sRGB) or Adobe RGB standard used widely for display devices in electronic devices such as personal computers, digital cameras, and printers; the International Telecommunication Union Radiocommunication Sector Broadcasting Service (Television) 709 (ITU-R BT.709) standard used for high-definition televisions (HDTV, also referred to Hi-Vision); the Digital Cinema Initiatives P3 (DCI-P3) standard used for digital cinema projection; and the ITU-R BT.2020 (Recommendation 2020 (REC.2020)) standard used for ultra-high-definition televisions (UHDTV, also referred to as Super Hi-Vision); and the like.

This embodiment can be implemented in appropriate combination with any of the structures described in the other embodiments and the like.

Embodiment 4

In this embodiment, a device structure example of the display device 110 will be described with reference to drawings.

Figure 21A:
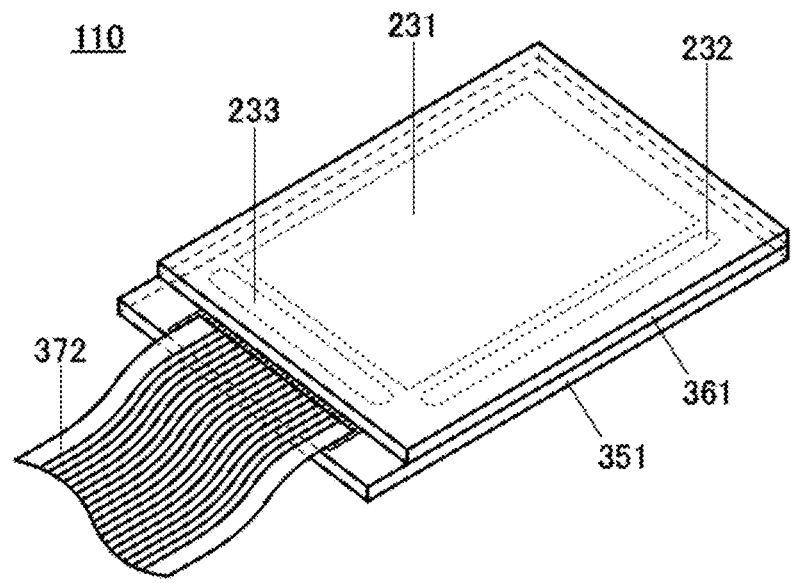
FIGS. 21A and 21B illustrate structure examples of a display device.
Figure 21B:
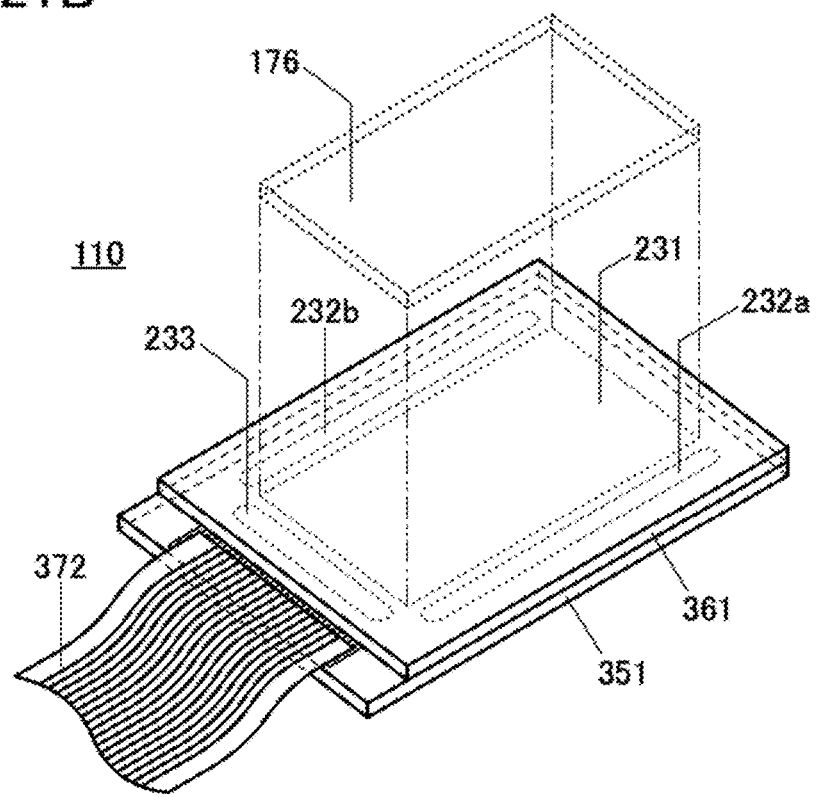

FIGS. 21A and 21B are perspective views illustrating an example of an appearance of the display device 110. As an external electrode, a flexible printed circuit (FPC) 372 is connected to the display device 110 illustrated in FIGS. 21A and 21B. The display device 110 illustrated in FIGS. 21A and 21B has a structure in which a substrate 351 and a substrate 361 are bonded. Furthermore, the display region 231, the circuit 232, and the circuit 233 are provided between the substrate 351 and the substrate 361.

As described above, the display region 231 includes the plurality of pixels 230 arranged in a matrix. As the circuit 232, for example, a scan line driver circuit can be used. As the circuit 233, a signal line driver circuit can be used, for example. Note that the scan line driver circuit and the signal line driver circuit are collectively referred to as "a driver circuit" in some cases.

Furthermore, as illustrated in FIG. 21B, the circuit 232 may be divided into a circuit 232a for liquid crystal elements and a circuit 232b for light-emitting elements. The circuit 233 may also be divided into a circuit for liquid crystal elements and a circuit for light-emitting elements.

The touch sensor 176 may be provided so as to overlap with the substrate 361. For example, the touch sensor 176 of a capacitive type with a sheet shape may be provided so as to overlap with the display region 231. The touch sensor 176 may be provided between the substrate 361 and the substrate 351.

The circuit 232 and the circuit 233 each include a plurality of transistors 201. The circuit 232 and the circuit 233 each have a function of determining which of the pixels 230 in the display region 231 is supplied with a signal through the FPC 372.

Structure Example 1

FIG. 22 illustrates an example of cross-sections of part of a region including the FPC 372, part of a region including the circuit 233, and part of a region including the display region 231 of the display device 110 illustrated in FIGS. 21A and 21B.

The display device 110 illustrated in FIG. 22 includes a transistor 201, a transistor 203, a transistor 205, a transistor 206, a liquid crystal element 180, a light-emitting element 170, an insulating layer 220, a coloring layer 131, a coloring layer 134, and the like, between the substrate 351 and the substrate 361. The substrate 361 and the insulating layer 220 are bonded to each other with an adhesive layer 141. The substrate 351 and the insulating layer 220 are bonded to each other with an adhesive layer 142.

The substrate 361 is provided with the coloring layer 131, a light-blocking layer 132, an insulating layer 121, an electrode 137 functioning as a common electrode of the liquid crystal element 180, an alignment film 133b, an insulating layer 138, and the like. A polarizing plate 135 is provided on an outer surface of the substrate 361. The insulating layer 121 may have a function of a planarization layer. The insulating layer 121 enables the electrode 137 to have an almost flat surface, resulting in a uniform alignment state of a liquid crystal 136. The insulating layer 138 serves as a spacer for holding a cell gap of the liquid crystal element 180. In the case where the insulating layer 138 transmits visible light, the insulating layer 138 may be positioned to overlap with a display region of the liquid crystal element 180.

The liquid crystal element 180 is a reflective liquid crystal element. The liquid crystal element 180 has a stacked-layer structure of an electrode 245a, the liquid crystal 136, and the electrode 137. The electrode 245b that reflects visible light is provided in contact with a surface of the electrode 245a on the substrate 351 side. The electrode 245b includes the opening 451. The electrode 245a and the electrode 137 transmit visible light. The alignment film 133a is provided between the liquid crystal 136 and the electrode 245a. The alignment film 133b is provided between the liquid crystal 136 and the electrode 137.

In the liquid crystal element 180, the electrode 245b has a function of reflecting visible light, and the electrode 137 has a function of transmitting visible light. Light entering from the substrate 361 side is polarized by the polarizing plate 135, transmitted through the electrode 137 and the liquid crystal 136, and reflected by the electrode 245b. Then, the light is transmitted through the liquid crystal 136 and the electrode 137 again to reach the polarizing plate 135. In this case, alignment of a liquid crystal can be controlled with a voltage that is applied between the electrode 245b and the electrode 137, and thus optical modulation of light can be controlled. In other words, the intensity of light emitted through the polarizing plate 135 can be controlled. Light excluding light in a particular wavelength region is absorbed by the coloring layer 131, and thus, emitted light is red light, for example.

As illustrated in FIG. 22, the electrode 245a that transmits visible light is preferably provided across the opening 451. Accordingly, the liquid crystal 136 is aligned in a region overlapping with the opening 451 as in the other regions, in which case an alignment defect of the liquid crystal is prevented from being generated in a boundary portion of these regions and undesired light leakage can be suppressed.

For example, a material containing one kind selected from indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Examples of a conductive material that reflects visible light include aluminum, silver, and an alloy including any of these metal materials. Furthermore, a metal material such as gold, platinum, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (also referred to as Ag—Pd—Cu or APC), or an alloy of silver and magnesium may be used.

At a connection portion 207, the electrode 245b is electrically connected to a conductive layer 222a included in the transistor 206 via a conductive layer 221b. The transistor 206 has a function of controlling the driving of the liquid crystal element 180.

A connection portion 252 is provided in part of a region where the adhesive layer 141 is provided. In the connection portion 252, a conductive layer obtained by processing the same conductive film as the electrode 245a is electrically connected to part of the electrode 137 with the connector 243. Accordingly, a signal or a potential input from the FPC 372 connected to the substrate 351 side can be supplied to the electrode 137 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 22, the connector 243, which is the conductive particle, has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connectors 243 are dispersed in the adhesive layer 141 before curing of the adhesive layer 141.

As the light-emitting element 170, a self-luminous light-emitting element such as an organic light-emitting diode (OLED), a light-emitting diode (LED), and a quantum-dot light-emitting diode (QLED) can be used.

Instead of a light-emitting display element, a transmissive liquid crystal element may be used. In the case where a transmissive liquid crystal element is used, the coloring layer, characteristics of the backlight, and the like are adjusted to set the peak wavelength, the half width, and the like.

The light-emitting element 170 described in this embodiment is a bottom-emission light-emitting element. The light-emitting element 170 has a stacked-layer structure in which the electrode 191, the EL layer 192, and the electrode 193 are stacked in this order from the insulating layer 220 side. The electrode 191 is connected to a conductive layer 222b included in the transistor 205 through an opening provided in the insulating layer 214. The transistor 205 has a function of controlling the driving of the light-emitting element 170. The insulating layer 216 covers an end portion of the electrode 191. The electrode 193 includes a material that reflects visible light, and the electrode 191 includes a material that transmits visible light. The insulating layer 194 is provided to cover the electrode 193. Light is emitted from the light-emitting element 170 to the substrate 361 side through the coloring layer 134, the insulating layer 220, the opening 451, the electrode 245a, and the like.

The light-emitting element 170 emits white light. The liquid crystal element 180 and the light-emitting element 170 can exhibit various colors when the color of the coloring layer varies among pixels. The display device 110 can display a color image using the liquid crystal element 180 and the coloring layer. The display device 110 can display a color image using the light-emitting element 170 and the coloring layer.

To achieve full-color display, the colors of the coloring layers combined with the light-emitting element 170 and the liquid crystal element 180 may be a combination of yellow, cyan, and magenta, as well as a combination of red, green, and blue. For example, the colors of the coloring layer combined with the light-emitting element 170 may be red, green, and blue, and the colors of the coloring layer combined with the liquid crystal element 180 may be cyan, magenta, and yellow. The colors of the combined coloring layer may be determined as appropriate in accordance with the purpose, the uses, or the like.

The transistor 201, the transistor 203, the transistor 205, and the transistor 206 are formed on a plane of the insulating layer 220 on the substrate 351 side. These transistors can be fabricated through the same process.

The transistor 203 is used for controlling whether the pixel is selected or not (such a transistor is also referred to as a switching transistor or a selection transistor). The transistor 205 is used for controlling a current flowing to the light-emitting element 170 (such a transistor is also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 201, 203, 205, and 206 includes a conductive layer 221a functioning as a gate, the insulating layer 211 functioning as the gate insulating layer, the conductive layer 222a and the conductive layer 222b functioning as a source and a drain, and a semiconductor layer 234. Here, a plurality of layers obtained by processing the same conductive film are shown with the same hatching pattern.

The transistor 201 and the transistor 205 each include a conductive layer 223 functioning as a gate, in addition to the components of the transistor 203 or the transistor 206.

The structure in which the semiconductor layer where a channel is formed is provided between two gates is used as an example of the transistors 201 and 205. Such a structure enables the control of the threshold voltages of transistors. The two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistors can be controlled.

There is no limitation on the structure of the transistors included in the display device. The transistor included in the circuit 233 and the transistor included in the display region 231 may have the same structure or different structures. A plurality of transistors included in the circuit 233 may have the same structure or a combination of two or more kinds of structures. Similarly, a plurality of transistors included in the display region 231 may have the same structure or a combination of two or more kinds of structures.

It is preferable to use a conductive material containing an oxide for the conductive layer 223. A conductive film used for the conductive layer 223 is formed under an atmosphere containing oxygen, whereby oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 234 by later heat treatment; as a result, oxygen vacancies in the semiconductor layer 234 can be reduced.

It is particularly preferable to use a low-resistance oxide semiconductor for the conductive layer 223. In that case, an insulating film that releases hydrogen, such as a silicon nitride film, is preferably used for the insulating layer 213, for example, because hydrogen can be supplied to the conductive layer 223 during the formation of the insulating layer 213 or by heat treatment performed after the formation of the insulating layer 213, which leads to an effective reduction in the electric resistance of the conductive layer 223.

The coloring layer 134 is provided in contact with the insulating layer 213. The coloring layer 134 is covered with the insulating layer 214.

A connection portion 204 is provided in a region where the substrate 351 does not overlap with the substrate 361. In the connection portion 204, the wiring 365 is electrically connected to the FPC 372 via a connection layer 242. The connection portion 204 has a similar structure to the connection portion 207. On the top surface of the connection portion 204, a conductive layer obtained by processing the same conductive film as the electrode 245a is exposed. Thus, the connection portion 204 and the FPC 372 can be electrically connected to each other via the connection layer 242.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

Note that a functional member such as a variety of optical members can be arranged on the outer surface of the substrate 361. Examples of the optical members include a polarizing plate, a retardation plate, a light diffusion layer (e.g., a diffusion film), an anti-reflective layer, and a light-condensing film. By using an anti-reflective layer or the like, the external-light reflectivity on a surface of the display device may be less than 1%, preferably less than 0.3%. Furthermore, examples of the functional member except the optical members include an antistatic layer preventing the attachment of dust, a water repellent layer suppressing the attachment of stain, and a hard coat layer suppressing generation of a scratch caused by the use.

A liquid crystal element having, for example, a vertical alignment (VA) mode can be used as the liquid crystal element 180. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 180. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a guest-host mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the reflective liquid crystal element is used, the polarizing plate 135 is provided on the display surface side. In addition, a light diffusion plate is preferably provided on the display surface side to improve visibility.

Note that using a guest-host mode liquid crystal element can eliminate the need for the polarizing plate 135.

A front light may be provided on the outer side of the polarizing plate 135. As the front light, an edge-light front light is preferably used. A front light including a light-emitting diode (LED) is preferably used to reduce power consumption.

As the adhesive layer, any of a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

As the connection layer 242, an anisotropic conductive film (ACF), an anisotropic conductive paste (ACP), or the like can be used.

The light-emitting element 170 may be a top emission, bottom emission, or dual emission light-emitting element, or the like. A conductive film that transmits visible light is used as the electrode through which light is extracted. A conductive film that reflects visible light is preferably used as the electrode through which light is not extracted.

The EL layer 192 includes at least a light-emitting layer. In addition to the light-emitting layer, the EL layer 192 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The emission color of the light-emitting element 170 can be changed to white, red, green, blue, cyan, magenta, yellow, or the like depending on the material that forms the EL layer 192.

As a full-color method, there are a method in which the light-emitting element 170 whose emission color is white is combined with a coloring layer and a method in which the light-emitting element 170 with a different emission color is provided in each pixel. The former method is more productive than the latter method. In other words, the latter method, which requires separate formation of the EL layer 192 subpixel by subpixel, is less productive than the former method. However, the latter method can produce the emission color with higher color purity than that of the emission color produced by the former method. When the light-emitting element 170 has a microcavity structure in the latter method, the color purity can be further increased.

Either a low molecular compound or a high molecular compound can be used for the EL layer 192, and an inorganic compound may also be included. The layers included in the EL layer 192 can be formed by any of the following methods: an evaporation method (including a vacuum evaporation method), a transfer method, a printing method, an inkjet method, a coating method, and the like.

The EL layer 192 may contain an inorganic compound such as quantum dots. When quantum dots are used for the light-emitting layer, quantum dots can function as light-emitting materials, for example.

[Substrate]

There is no particular limitation on a material used for the substrate 351 and the substrate 361. The material is determined according to the purpose in consideration of whether it has a light-transmitting property, heat resistance high enough to withstand heat treatment, or the like. For example, a glass substrate of barium borosilicate glass, aluminosilicate glass, or the like, a ceramic substrate, a quartz substrate, a sapphire substrate, or the like can be used. Alternatively, a semiconductor substrate, a flexible substrate, an attachment film, a base film, or the like may be used as the substrate 271.

As the semiconductor substrate, a semiconductor substrate of silicon, germanium, or the like or a compound semiconductor substrate of silicon carbide, silicon germanium, gallium arsenide, indium phosphide, zinc oxide, or gallium oxide, or the like is used, for example. As the semiconductor substrate, a single-crystal semiconductor or a polycrystalline semiconductor may be used.

To increase the flexibility of the display device 110, a flexible substrate, an attachment film, a base material film, or the like is preferably used as each of the substrate 351 and the substrate 361.

As materials of the flexible substrate, the attachment film, and the base material film, the following materials can be used, for example: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyolefin, polyamide (e.g., nylon or aramid), polyimide, polycarbonate, aramid, an epoxy resin, an acrylic resin, and the like.

When any of the above-described materials is used for the substrates, a lightweight display device can be provided. Furthermore, when any of the above-described materials is used for the substrates, a shock-resistant display device can be provided. Moreover, when any of the above-described materials is used for the substrates, a non-breakable display device can be provided.

The flexible substrate used as the substrate 351 or 361 preferably has a lower coefficient of linear expansion because deformation due to an environment is suppressed. The flexible substrate used as the substrate 351 or 361 is formed using, for example, a material whose coefficient of linear expansion is lower than or equal to $1\times10^{-3}$/K, lower than or equal to $5\times10^{-5}$/K, or lower than or equal to $1\times10^{-5}$/K. In particular, aramid is preferably used for the flexible substrate because of its low coefficient of linear expansion.

[Conductive Layer]

As materials of a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stacked film of any of the above materials can be used for the conductive layers. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin material such as an acrylic or epoxy resin, and an inorganic insulating material such as silicon oxide, silicon oxynitride, silicon nitride oxide, silicon nitride, or aluminum oxide.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Structure Example 2

Figure 23:
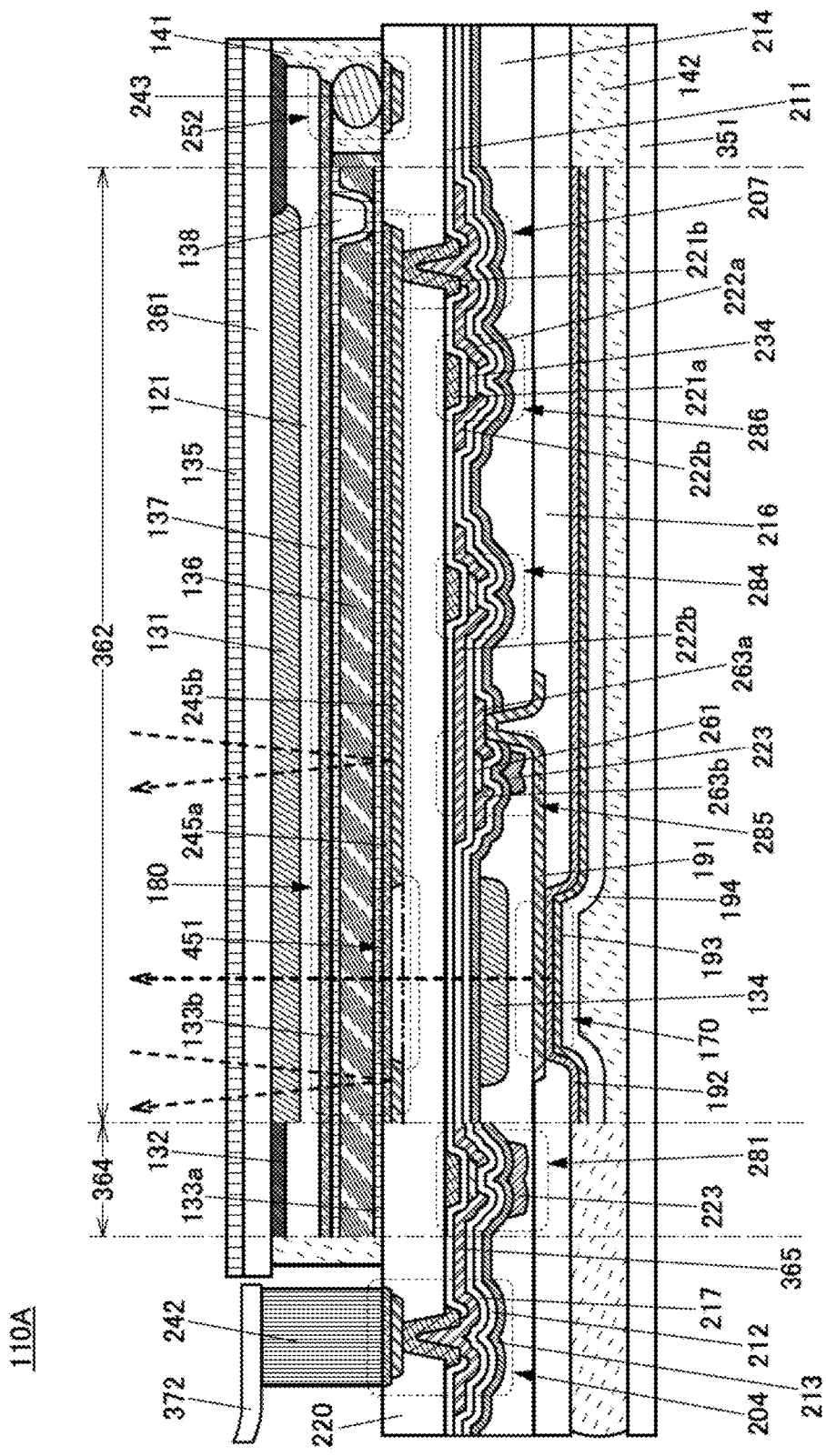
FIG. 23 illustrates a structure example of a display device.

A display device 110A illustrated in FIG. 23 is different from the display device 110 mainly in that a transistor 281, a transistor 284, a transistor 285, and a transistor 286 are included instead of the transistor 201, the transistor 203, the transistor 205, and the transistor 206.

Note that the positions of the insulating layer 138, the connection portion 207, and the like in FIG. 23 are different from those in FIG. 22. FIG. 23 illustrates an end portion of a pixel. The insulating layer 138 is provided so as to overlap with an end portion of the coloring layer 131 and an end portion of the light-blocking layer 132. As in this structure, the insulating layer may be provided in a region not overlapping with a display region (or in a region overlapping with the light-blocking layer 132).

Two transistors included in the display device may partly overlap with each other like the transistor 284 and the transistor 285. In that case, the area occupied by a pixel circuit can be reduced, leading to an increase in resolution. Furthermore, the light-emitting area of the light-emitting element 170 can be increased, leading to an improvement in aperture ratio. The light-emitting element 170 with a high aperture ratio requires low current density to obtain necessary luminance; thus, the reliability is improved.

Each of the transistors 281, 284, and 286 includes the conductive layer 221a, the insulating layer 211, the semiconductor layer 234, the conductive layer 222a, and the conductive layer 222b. The conductive layer 221a overlaps with the semiconductor layer 234 with the insulating layer 211 positioned therebetween. The conductive layer 222a and the conductive layer 222b are electrically connected to the semiconductor layer 234. The transistor 281 includes the conductive layer 223.

The transistor 285 includes the conductive layer 222b, an insulating layer 217, a semiconductor layer 261, the conductive layer 223, the insulating layer 212, the insulating layer 213, a conductive layer 263a, and a conductive layer 263b. The conductive layer 222b overlaps with the semiconductor layer 261 with the insulating layer 217 positioned therebetween. The conductive layer 223 overlaps with the semiconductor layer 261 with the insulating layers 212 and 213 positioned therebetween. The conductive layer 263a and the conductive layer 263b are electrically connected to the semiconductor layer 261.

The conductive layer 221a functions as a gate. The insulating layer 211 functions as a gate insulating layer. The conductive layer 222a functions as one of a source and a drain. The conductive layer 222b included in the transistor 286 functions as the other of the source and the drain.

The conductive layer 222b shared by the transistor 284 and the transistor 285 has a portion functioning as the other of a source and a drain of the transistor 284 and a portion functioning as a gate of the transistor 285. The insulating layer 217, the insulating layer 212, and the insulating layer 213 function as gate insulating layers. One of the conductive layer 263a and the conductive layer 263b functions as a source and the other functions as a drain. The conductive layer 223 functions as a gate.

Structure Example 3

Figure 24A:
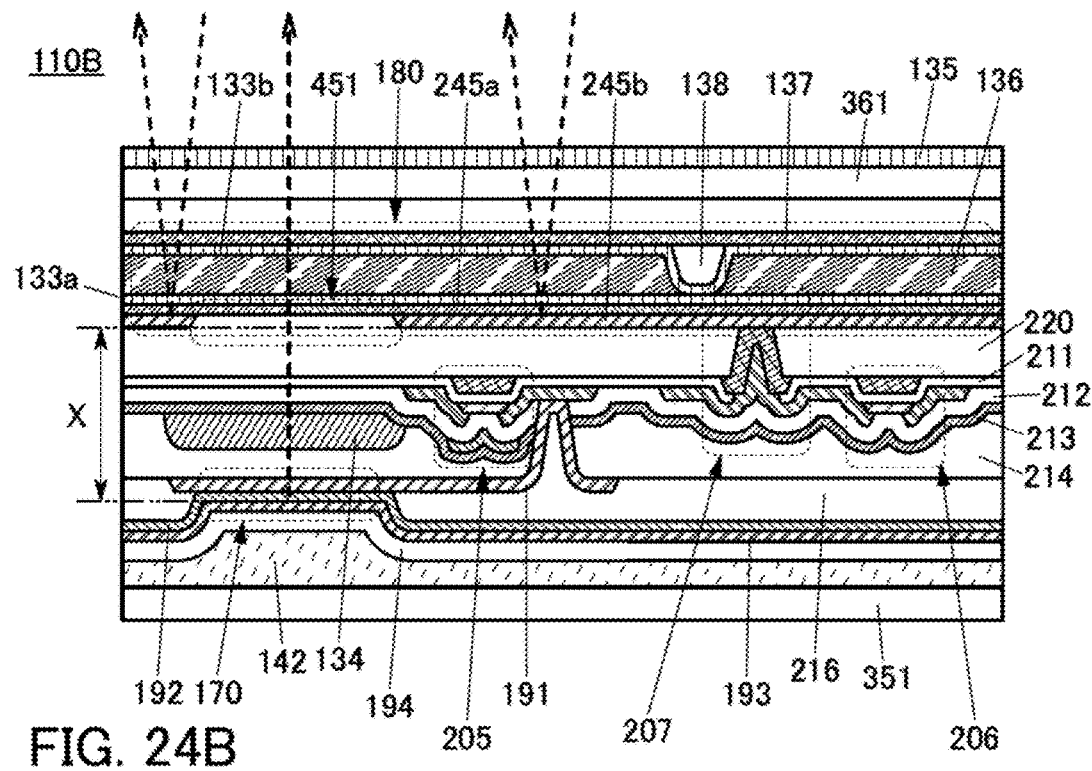
FIGS. 24A and 24B each illustrate a structure example of a display device.

FIG. 24A is a cross-sectional view illustrating a display portion of a display device 110B.

The display device 110B is different from the display device 110 in that the coloring layer 131 is not provided. Other components are similar to those of the display device 110 and thus are not described in detail.

The liquid crystal element 180 emits white light. Since the coloring layer 131 is not provided, the display device 110B can display a black and white image or a grayscale image using the liquid crystal element 180.

Structure Example 4

Figure 24B:
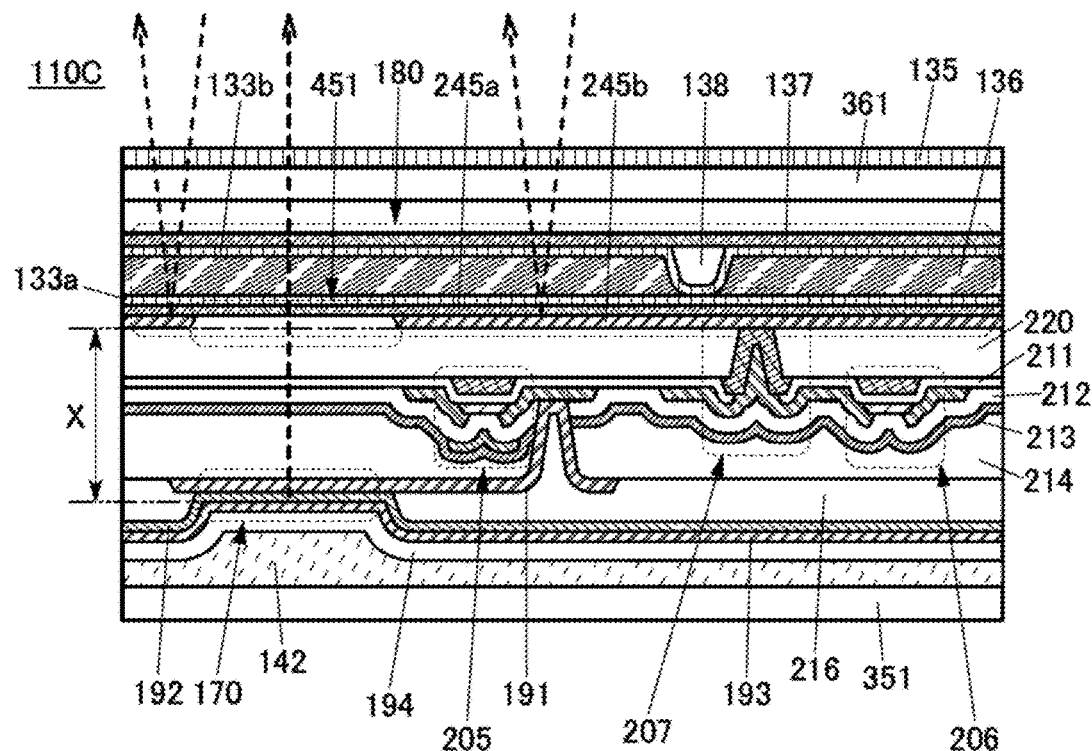

A display device 110C illustrated in FIG. 24B is different from the display device 110B in that the EL layer 192 is separately provided for each emission color and the coloring layer 134 is not provided. Other components are similar to those of the display device 110B and thus are not described in detail.

In the light-emitting element 170 employing a separate coloring method, at least one layer (typified by the light-emitting layer) included in the EL layer 192 is separately provided for each color. All layers included in the EL layer may be separately provided for each color.

[Transistor]

There is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

Note that when one of the gate electrodes provided above and below a channel is referred to as "a gate electrode", the other is referred to as "a back gate electrode." In addition, when one of the gate electrodes provided above and below a channel is referred to as "a gate", the other is referred to as "a back gate." Note that the gate electrode may be referred to as "a front gate." Similarly, the gate may be referred to as "a front gate."

When the gate electrode and the back gate electrode are provided, a semiconductor layer of the transistor can be electrically surrounded by an electric field generated from the gate electrode and an electric field generated from the back gate electrode. Such a transistor structure in which electric fields generated from the gate electrode and the back gate electrode electrically surround the semiconductor layer where the channel is formed can be referred to as a surrounded-channel (S-channel) structure.

The backgate electrode can function in a manner similar to that of the gate electrode. The potential of the back gate electrode may be the same as that of the gate electrode or may be a ground potential or a predetermined potential. By changing the potential of the back gate electrode independently of the potential of the gate electrode, the threshold voltage of the transistor can be changed.

By providing the gate electrode and the back gate electrode and by setting the potentials of the gate electrode and the back gate electrode to be the same, a region of the semiconductor layer through which carriers flow is enlarged in the film thickness direction; thus, the amount of carrier transfer is increased. As a result, the on-state current and the field-effect mobility of the transistor are increased.

Therefore, the transistor can have a large on-state current for its area. That is, the area occupied by the transistor can be small for required on-state current. Therefore, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode in the plan view, the electric field blocking function can be enhanced.

Since the gate electrode and the back gate electrode each have a function of blocking an electric field from the outside, charges of charged particles and the like generated above and below the transistor do not influence the channel formation region of the semiconductor layer. Thus, degradation due to a stress test (e.g., a negative gate bias temperature (also referred to as NGBT, NBT, or NBTS) stress test in which negative voltage is applied to a gate) can be reduced. In addition, the gate electrode and the back gate electrode can block an electric field generated from the drain electrode so as not to affect the semiconductor layer. Thus, changes in the rising voltage of on-state current due to changes in drain voltage can be suppressed. Note that this effect is significant when a potential is applied to the gate electrode and the back gate electrode.

Before and after a positive gate bias temperature (PGBT) stress test where positive voltage is applied to a gate (this stress test is also referred to as PBT or PBTS)), a transistor including a back gate electrode has a smaller change in threshold voltage than a transistor including no back gate electrode.

The BT stress test such as NGBT or PGBT is a kind of accelerated test and can evaluate, in a short time, a change by long-term use (i.e., a change over time) in characteristics of transistors. In particular, the amount of a change in threshold voltage of the transistor between before and after the BT stress test is an important indicator when examining the reliability of the transistor. If the amount of a change in the threshold voltage between before and after the BT stress test is small, the transistor has higher reliability.

By providing the gate electrode and the back gate electrode and setting the potentials of the gate electrode and the back gate electrode to be the same, the change in threshold voltage is reduced. Accordingly, variation in electrical characteristics among a plurality of transistors is also reduced.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

[Semiconductor Material]

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

For example, as a semiconductor material used for a transistor, amorphous silicon, microcrystalline germanium, or the like can be used. Alternatively, a compound semiconductor such as silicon carbide, gallium arsenide, a metal oxide, or a nitride semiconductor, an organic semiconductor, or the like can be used.

As a semiconductor material used for the transistor, an oxide semiconductor which is one kind of a metal oxide can be used. Typically, an oxide semiconductor containing indium or the like can be used.

In particular, a semiconductor material having a wider band gap and a lower carrier density than silicon is preferably used because off-state current between the source and the drain of the transistor can be reduced.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to In, Zn, and M.

Examples of the stabilizer, including metals that can be used as M, are gallium, tin, hafnium, aluminum, and zirconium. As another example of the stabilizer, lanthanoid such as lanthanum, cerium, praseodymium, neodymium, samarium, europium, gadolinium, terbium, dysprosium, holmium, erbium, thulium, ytterbium, or lutetium can be given.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. In addition to In, Ga, and Zn, another metal element may be contained.

This embodiment can be implemented in appropriate combination with any of the structures described in the other embodiments and the like.

Embodiment 5

Examples of an electronic device that can use the display device of one embodiment of the present invention include display devices such as televisions and monitors, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines.

Figure 25A:
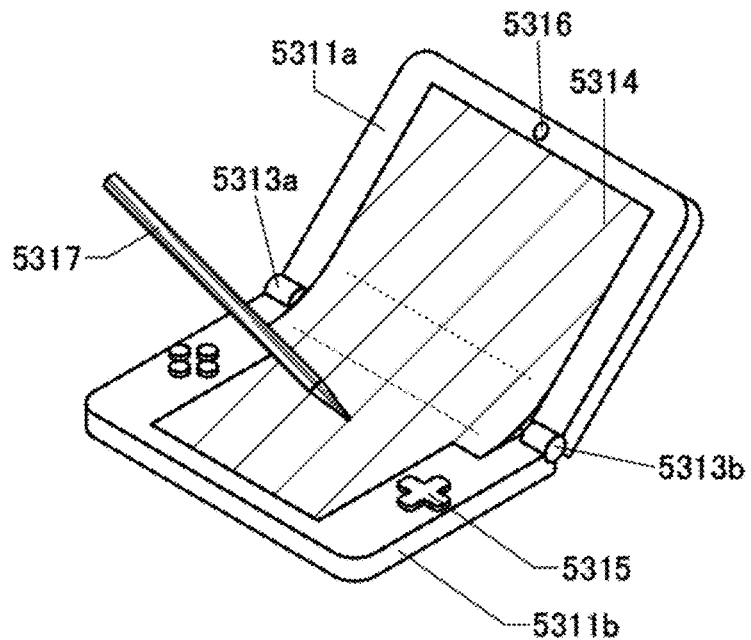
FIGS. 25A and 25B illustrate examples of an electronic device.

FIG. 25A illustrates a portable game machine including a housing 5311a, a housing 5311b, a hinge 5313a, a hinge 5313b, a display portion 5314, an operation key 5315, a camera 5316, and the like. The display device of one embodiment of the present invention can be used in the display portion 5314. The display portion 5314 has flexibility and can be folded using the hinge 5313a and the hinge 5313b as an axis. Furthermore, a touch sensor is provided in the display portion 5314, so that input operations can be performed with a stylus 5317 or the like. The display portion 5314 that uses the display device of one embodiment of the present invention can increase the portability and visibility. Further, power consumption can be reduced.

Figure 25B:
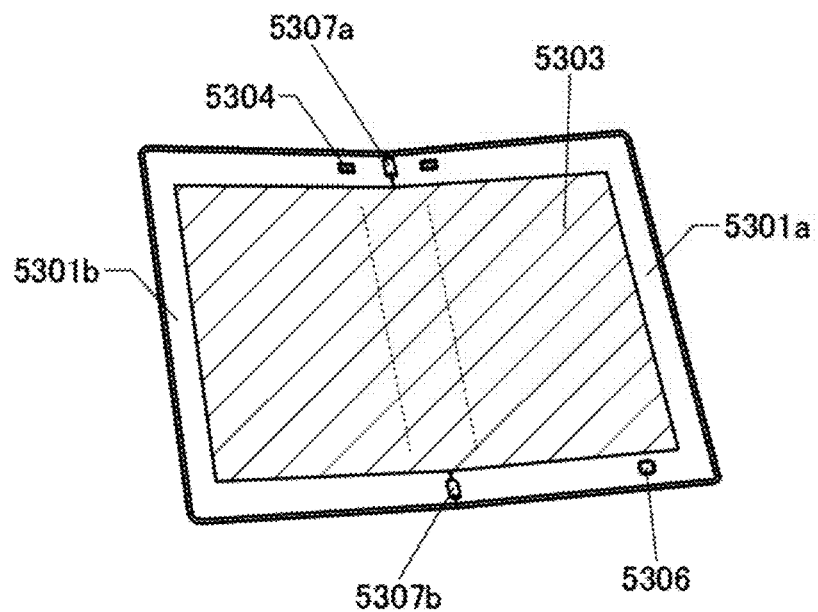

FIG. 25B illustrates a tablet personal computer including a housing 5301a, a housing 5301b, a display portion 5303, a photosensor 5304, a switch 5306, and the like. The display portion 5303 is supported by the housing 5301a and the housing 5301b. The display portion 5303 is formed using a flexible substrate and thus has a function of being bendable flexibly. By changing the angle between the housing 5301a and the housing 5301b with a hinge 5307a and a hinge 5307b, the display portion 5303 can be folded so that the housing 5301a and the housing 5301b overlap with each other. Although not illustrated, an open/close sensor may be incorporated so that the above-described angle change can be used as information about conditions of use of the display portion 5303. The display portion 5303 that uses the display device of one embodiment of the present invention can increase the portability and visibility. Further, power consumption can be reduced.

This embodiment can be implemented in appropriate combination with any of the structures described in the other embodiments and the like.

Embodiment 6

<Composition of CAC-OS>

Described below is the composition of a cloud-aligned composite oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

[Structure of Samples and Formation Method Thereof]

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

[Analysis by X-Ray Diffraction]

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 26:
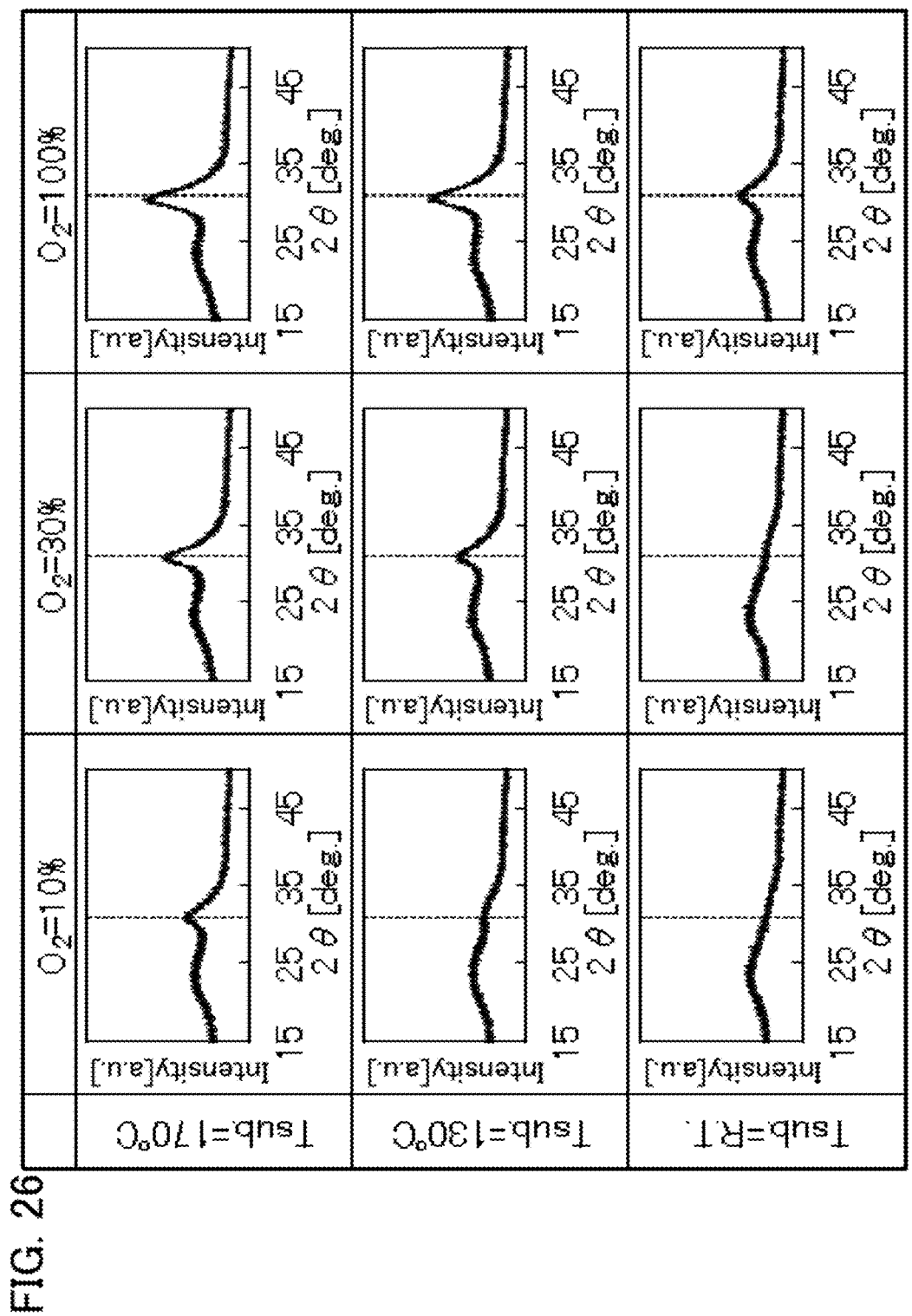
FIG. 26 shows measured XRD spectra of samples.

FIG. 26 shows XRD spectra measured by an out-of-plane method. In FIG. 26, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 26, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 26, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

[Analysis with Electron Microscope]

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 27A is a plan-view TEM image of the sample formed at a substrate temperature of R.T. and with an oxygen gas flow rate ratio of 10%. FIG. 27B is a cross-sectional TEM image of the sample formed at a substrate temperature of R.T. and with an oxygen gas flow rate ratio of 10%.

[Analysis of Electron Diffraction Patterns]

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 27A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 27C, 27D, 27E, 27F, and 27G show the results of the points indicated by the black dots a1, a2, a3, a4, and a5, respectively.

In FIGS. 27C, 27D, 27E, 27F, and 27G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 27B of the sample formed at a substrate temperature of R.T. and an oxygen gas flow rate ratio of 10% are observed. FIGS. 27H, 27I, 27J, 27K, and 27L show the results of the points indicated by the black dots b1, b2, b3, b4, and b5, respectively.

In FIGS. 27H, 27I, 27J, 27K, and 27L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

[Elementary Analysis]

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 28A:
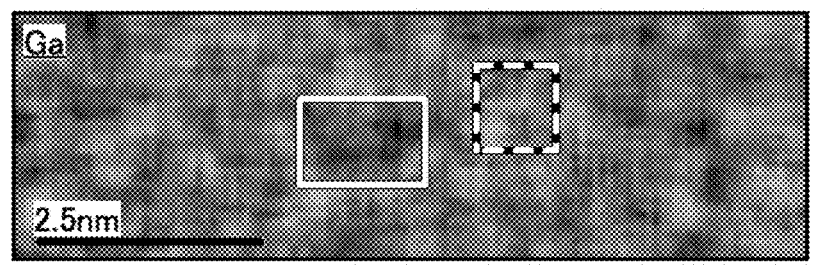
FIGS. 28A to 28C show EDX mapping images of a sample.
Figure 28B:
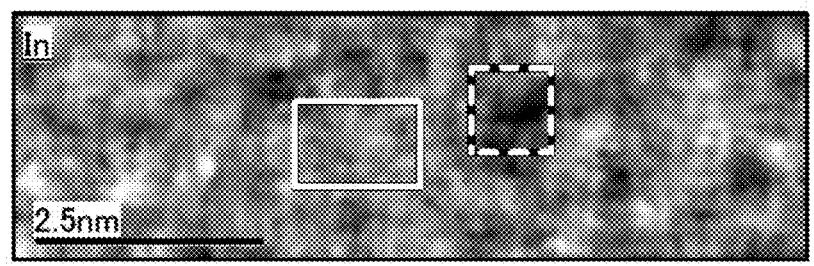
Figure 28C:
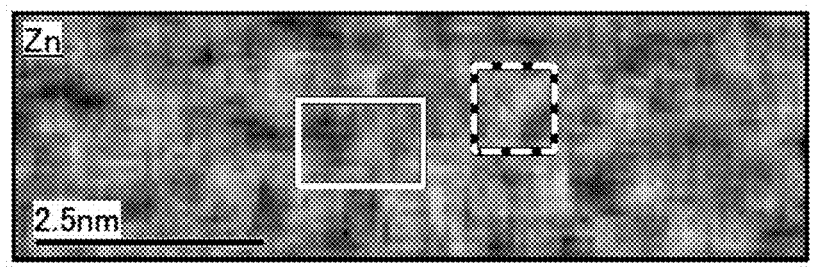

FIGS. 28A to 28C show EDX mapping images in a cross section of the sample formed at a substrate temperature of R.T. and with an oxygen gas flow rate ratio of 10%. FIG. 28A shows an EDX mapping image of Ga atoms. The proportion of the Ga atoms in all the atoms is 1.18 atomic % to 18.64 atomic %. FIG. 28B shows an EDX mapping image of In atoms. The proportion of the In atoms in all the atoms is 9.28 atomic % to 33.74 atomic %. FIG. 28C shows an EDX mapping image of Zn atoms. The proportion of the Zn atoms in all the atoms is 6.69 atomic % to 24.99 atomic %. FIGS. 28A to 28C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 28A to 28C is 7200000 times.

The EDX mapping images in FIGS. 28A to 28C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 28A to 28C are examined.

In FIG. 28A, a relatively dark region occupies a large area in the area surrounded by the solid line, while a relatively bright region occupies a large area in the area surrounded by the dashed line. In FIG. 28B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 28C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 28C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 28A to 28C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 28A to 28C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

This embodiment can be implemented in appropriate combination with any of the structures described in the other embodiments and the like.

This application is based on Japanese Patent Application Serial No. 2016-196211 filed with Japan Patent Office on Oct. 4, 2016 and Japanese Patent Application Serial No.

2016-196213 filed with Japan Patent Office on Oct. 4, 2016, the entire contents of which are hereby incorporated by reference.

What is claimed is:

1. An electronic device comprising:
a first housing;
a second housing;
a hinge connecting the first housing and the second housing;
a display device having flexibility; and
a structure body comprising an elastic material,
wherein the structure body is between the first housing and the second housing and changes in shape when the electronic device is opened or folded,
wherein the display device comprises a first display region overlapping with the first housing, a second display region overlapping with the second housing, and a third display region between the first display region and the second display region,
wherein the electronic device is configured to be folded such that the first display region and the second display region face each other and the third display region is in a space in a neighborhood of the hinge,
wherein a distance between the first housing and the second housing is maintained by the space,
wherein an inside diameter of a bent portion of the third display region is larger than the distance between the first housing and the second housing when the electronic device is in a closed state, and
wherein the bent portion of the third display region is not in contact with the first housing and the second housing when the electronic device is in the closed state.

2. The electronic device according to claim 1,
wherein the hinge comprises a first hinge and a second hinge, and
wherein the space is between the first hinge and the second hinge.

3. The electronic device according to claim 1, wherein the structure body has a pleated shape.

4. The electronic device according to claim 1, wherein the electronic device is configured to be opened such that a relative angle between the first display region and the second display region is kept at more than or equal to 145° and less than 175°.

5. The electronic device according to claim 1, wherein the electronic device is configured to be opened such that a relative angle between the first display region and the second display region is kept at more than or equal to 105° and less than 135°.

6. The electronic device according to claim 1, wherein the third display region is in the space when an angle between the first display region and the second display region is more than or equal to 0° and less than 80°.

7. The electronic device according to claim 1, wherein the inside diameter of the bent portion of the third display region in the closed state is more than or equal to 1 mm and less than or equal to 50 mm.

8. The electronic device according to claim 1, wherein the structure body is in contact with the bent portion of the third display region when the electronic device is in the closed state.

9. An electronic device comprising:
a first housing;
a second housing;
a hinge connecting the first housing and the second housing;
a display device having flexibility; and
a structure body comprising an elastic material,
wherein the structure body is between the first housing and the second housing and changes in shape when the electronic device is opened or folded,
wherein the display device comprises a first display region overlapping with the first housing, a second display region overlapping with the second housing, a third display region between the first display region and the second display region, and a fourth display region overlapping with a side surface of the first housing,
wherein the first display region and the fourth display region are configured to form a continuous display region,
wherein the electronic device is configured to be folded such that the first display region and the second display region face each other and the third display region is in a space in a neighborhood of the hinge,
wherein a distance between the first housing and the second housing is maintained by the space,
wherein an inside diameter of a bent portion of the third display region is larger than the distance between the first housing and the second housing when the electronic device is in a closed state, and
wherein the bent portion of the third display region is not in contact with the first housing and the second housing when the electronic device is in the closed state.

10. The electronic device according to claim 9, wherein the display device further comprises a fifth display region overlapping with a side surface of the second housing.

11. The electronic device according to claim 9,
wherein the hinge comprises a first hinge and a second hinge, and
wherein the space is between the first hinge and the second hinge.

12. The electronic device according to claim 9, wherein the structure body has a pleated shape.

13. The electronic device according to claim 9, wherein the electronic device is configured to be opened such that a relative angle between the first display region and the second display region is kept at more than or equal to 145° and less than 175°.

14. The electronic device according to claim 9, wherein the electronic device is configured to be opened such that a relative angle between the first display region and the second display region is kept at more than or equal to 105° and less than 135°.

15. The electronic device according to claim 9, wherein the third display region is in the space when an angle between the first display region and the second display region is more than or equal to 0° and less than 80°.

16. The electronic device according to claim 9, wherein the inside diameter of the bent portion of the third display region in the closed state is more than or equal to 1 mm and less than or equal to 50 mm.

17. The electronic device according to claim 9, wherein the structure body is in contact with the bent portion of the third display region when the electronic device is in the closed state.

18. An electronic device comprising:
a first housing;
a second housing;
a hinge connecting the first housing and the second housing;
a display device having flexibility; and
a structure body comprising an elastic material, wherein the structure body is between the first housing and the second housing and changes in shape when the electronic device is opened or folded, wherein the display device comprises a first display region overlapping with the first housing, a second display region overlapping with the second housing, and a third display region between the first display region and the second display region, wherein the electronic device is configured to be folded such that the first display region and the second display region face each other and the third display region is in a space in a neighborhood of the hinge, wherein a distance between the first housing and the second housing is maintained by the space, and wherein an inside diameter of a bent portion of the third display region is larger than the distance between the first housing and the second housing when the electronic device is in a closed state.

19. The electronic device according to claim 18, wherein the third display region is in the space when an angle between the first display region and the second display region is more than or equal to 0° and less than 80°.

20. The electronic device according to claim 18, wherein the inside diameter of the bent portion of the third display region in the closed state is more than or equal to 1 mm and less than or equal to 50 mm.

* * * * *